(12) United States Patent
Fujita

(10) Patent No.: US 7,045,762 B2
(45) Date of Patent: May 16, 2006

(54) PHOTOCURRENT-TO-VOLTAGE CONVERSION APPARATUS INCLUDING NON-DIODE-CONNECTED CLAMPING MOS TRANSISTOR

(75) Inventor: Yuji Fujita, Ohtsu (JP)

(73) Assignee: NEC Compound Semiconductor Devices Ltd., Kanagawa (JP)

( * ) Notice: Subject to any disclaimer, the term of this patent is extended or adjusted under 35 U.S.C. 154(b) by 91 days.

(21) Appl. No.: 10/900,185

(22) Filed: Jul. 28, 2004

(65) Prior Publication Data

US 2005/0023443 A1 Feb. 3, 2005

(30) Foreign Application Priority Data

Jul. 30, 2003 (JP) ............... 2003-282232

(51) Int. Cl.
*H03F 3/08* (2006.01)
*H01J 40/14* (2006.01)

(52) U.S. Cl. .............. 250/214 A; 250/214 R; 327/514; 330/308

(58) Field of Classification Search ........... 250/214 A, 250/214 R; 330/308; 327/514
See application file for complete search history.

(56) References Cited

U.S. PATENT DOCUMENTS

| 5,714,909 | A | * | 2/1998 | Jackson ............... 330/308 |
| 5,801,588 | A | | 9/1998 | Nishiyama |
| 5,892,220 | A | | 4/1999 | Woodward |
| 6,307,433 | B1 | | 10/2001 | Ikeda |
| 6,384,689 | B1 | | 5/2002 | Kimura |

FOREIGN PATENT DOCUMENTS

| JP | 61 041213 | 2/1986 |
| JP | 2557339 | 9/1996 |
| JP | 10 284955 | 10/1998 |

* cited by examiner

*Primary Examiner*—Stephone B. Allen
*Assistant Examiner*—Suezu Ellis
(74) *Attorney, Agent, or Firm*—Young & Thompson

(57) ABSTRACT

In a photocurrent-to-voltage conversion apparatus for converting a photocurrent flowing through a light receiving element into a detection voltage, an amplifier, a feedback resistor and a clamping MOS transistor are provided. The amplifier has an input connected to the light receiving element and an output for generating the detection voltage, and includes (2n+1) inverter stages connected in series where n is 1, 2 . . . . The feedback resistor and the clamping transistor are connected between the output and input of the amplifier. The clamping MOS transistor is controlled by an output voltage of a non-final inverter one of the inverter stages.

16 Claims, 17 Drawing Sheets

PHOTOCURRENT-TO-VOLTAGE CONVERSION APPARATUS INCLUDING NON-DIODE-CONNECTED CLAMPING MOS TRANSISTOR

BACKGROUND OF THE INVENTION

1. Field of the Invention

The present invention relates to a photocurrent-to-voltage conversion apparatus including a clamping MOS transistor.

2. Description of the Related Art

Generally, in factor automation (FA) or the like, in order to electrically isolate an input from an output in a servo controller, a sequencer, an inverter or the like, a photocoupler has been developed. In such a photo coupler, a photocurrent-to-voltage conversion apparatus is used in a light receiving circuit thereof. Also, a photocurrent-to-voltage conversion apparatus is used in a light detection circuit in infrared communication or optical cable communication. Further, a photocurrent-to-voltage conversion apparatus is used in a light detection circuit for converting a laser reflection signal into an electrical digital signal of an optical disc unit.

A first prior art photocurrent-to-voltage conversion apparatus for a photodiode is constructed by an operational amplifier connected to the cathode of the photodiode and a negative feedback resistor connected between an output and an input of the operational amplifier (see: FIG. 4 of JP-A-61-41213). This will be explained later in detail.

In the above-described first prior art photocurrent-to-voltage conversion apparatus, however, when the strength of a light signal incident to the photodiode is very large, the operational amplifier would be saturated, so that waveform distortion between a photocurrent flowing through the photodiode and a detection voltage would be generated. Thus, an accurate light transmission would not be expected.

In a second prior art photocurrent-to-voltage conversion apparatus, a diode serving as a clamp element is connected in parallel with the negative feedback resistor of the first prior art photocurrent-to-voltage conversion apparatus (see: FIG. 5 of JP-A-61-41213). Also, in a third prior art photocurrent-to-voltage conversion apparatus, a diode-connected N-channel MOS transistor serving as a clamp element is connected in parallel with the negative feedback resistor of the first prior art photocurrent-to-voltage conversion apparatus (see: FIG. 1 of JP-A-61-41213). The second and third photocurrent-to-voltage conversion apparatuses also will be explained later in detail.

In the above-described second and third prior art photocurrent-to-voltage conversion apparatuses, however, when the difference in voltage between the input and output of the operational amplifier has a characteristic where the saturated difference is smaller than the clamp voltage of the clamp element, the operational amplifier is saturated before a current flows through the clamp element, so that the waveform distortion between the photocurrent and the detection voltage would still be generated.

Also, in the above-described second and third prior art photocurrent-to-voltage conversion apparatuses, when the difference in voltage between the input and output of the operational amplifier has a characteristic where the saturated difference is larger than the clamp voltage of the clamp element, a current flows through the clamp element before the operational amplifier is saturated, so that the detection voltage is clamped at a voltage lower than an expected value.

SUMMARY OF THE INVENTION

It is an object of the present invention to provide a photocurrent-to-voltage conversion apparatus capable of suppressing saturation of an operational amplifier where the saturated voltage of the operational amplifier is small.

Another object is to provide a photocurrent-to-voltage conversion apparatus capable of obtaining an expected clamped level of the detection voltage, where the saturated voltage of the operational amplifier is large.

According to the present invention, in a photocurrent-to-voltage conversion apparatus for converting a photocurrent flowing through a light receiving element into a detection voltage, an amplifier, a feedback resistor and a clamping MOS transistor are provided. The amplifier has an input connected to the light receiving element and an output for generating the detection voltage, and includes (2n+1) inverter stages connected in series where n is 1, 2 . . . . The feedback resistor and the clamping transistor are connected between the output and input of the amplifier. The clamping MOS transistor is controlled by an output voltage of a non-final inverter one of the inverter stages.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENTS

Before the description of the preferred embodiments, prior art photocurrent-to-voltage conversion apparatuses will be explained with reference to FIGS. 1, 2, 3, 4A, 4B, 5A and 5B.

Figure 1:
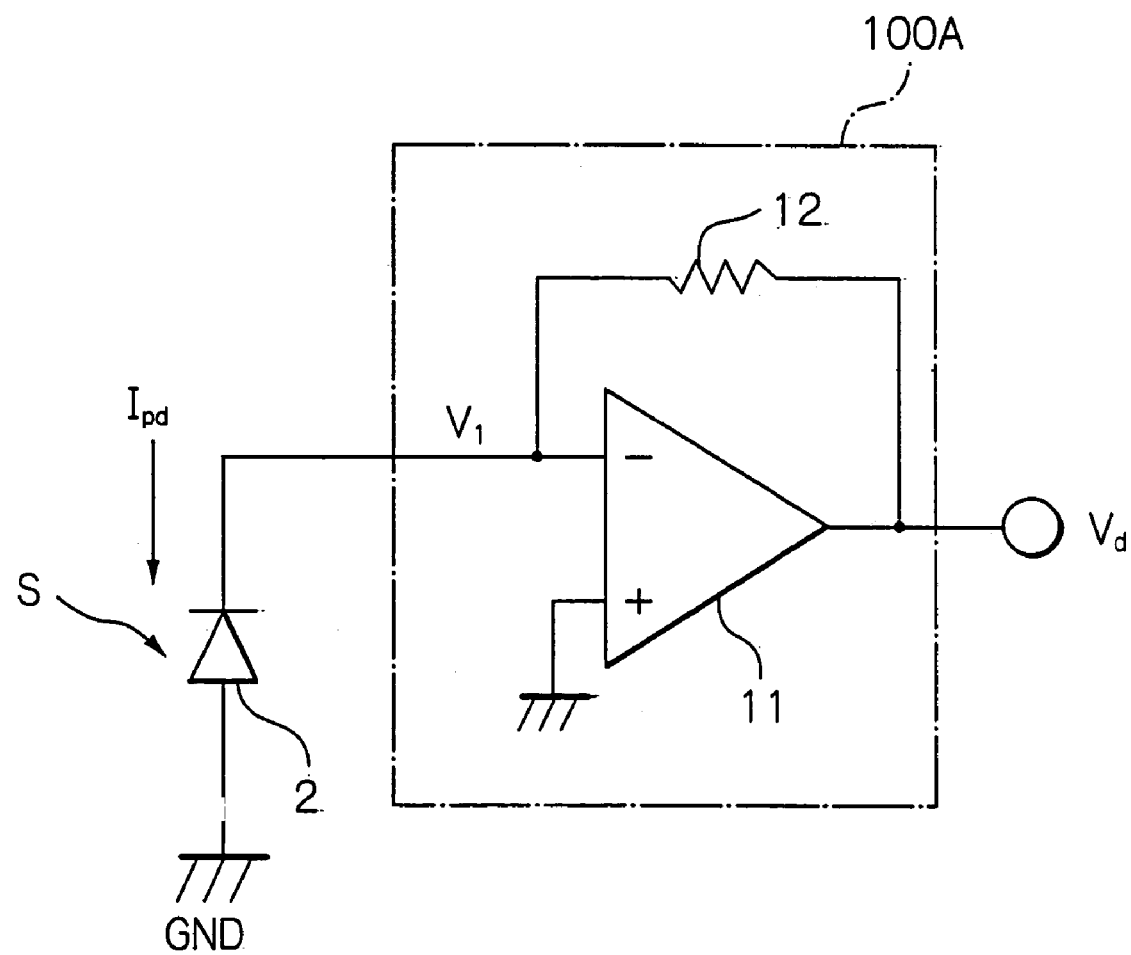
FIG. 1 is a circuit diagram illustrating a first prior art photocurrent-to-voltage conversion apparatus.

In FIG. 1, which illustrates a first prior art photocurrent-to-voltage conversion apparatus (see: FIG. 4 of JP-A-61-41213), a photocurrent-to-voltage conversion apparatus 100A is connected to a cathode of a photodiode 2 whose anode is grounded.

A reverse bias voltage is applied to the photodiode 2. Therefore, when the photodiode 2 receives a light signal S, a photocurrent $I_{pd}$ flows from the cathode to the anode. The photocurrent-to-voltage conversion apparatus 100A converts the photocurrent $I_{pd}$ into a detection voltage $V_d$.

The photocurrent-to-voltage conversion apparatus 100A is constructed by an operational amplifier 11 of a differential amplifier type having a grounded non-inverting input and an inverting input connected to the cathode of the photodiode 2, and a negative feedback resistor 12 connected between the output and inverting input of the operational amplifier 11. For example, the operational amplifier 11 is constructed by a differential amplifier and a push-pull output circuit in response to the output signals of the differential amplifier.

In FIG. 1, when no light signal is incident to the photodiode 2, no photocurrent $I_{pd}$ flows therethrough. As a result, since no current flows through the negative feedback resistor 12, the detection voltage $V_d$ is the same as a voltage $V_1$ at the inverting input of the operational amplifier 11, i.e., $$V_d = V_1 = V_0 \qquad (1)$$

where $V_0$ is a reverse bias voltage determined by an offset voltage of the differential amplifier of the operational amplifier 11.

In FIG. 1, when a light signal S is incident to the photodiode 2, a photocurrent $I_{pd}$ flows therethrough. As a result, the current $I_{pd}$ flows through the negative feedback resistor 12, so that the detection voltage $V_d$ is given by $$V_d = V_1 + I_{pd} \cdot R_f \approx V_0 + I_{pd} \cdot R_f \qquad (2)$$

where $R_f$ is a resistance value of the negative feedback resistor 12.

Thus, from the formulae (1) and (2), it is possible to determine whether or not a light signal S is incident to the photodiode 2.

In the photocurrent-to-voltage conversion apparatus 100A of FIG. 1, however, when the strength of the light signal S incident to the photodiode 2 is very large, the operational amplifier 11 would be saturated, so that waveform distortion between the photocurrent $I_{pd}$ and the detection voltage $V_d$ would be generated. Thus, an accurate light transmission would not be expected.

Figure 2:
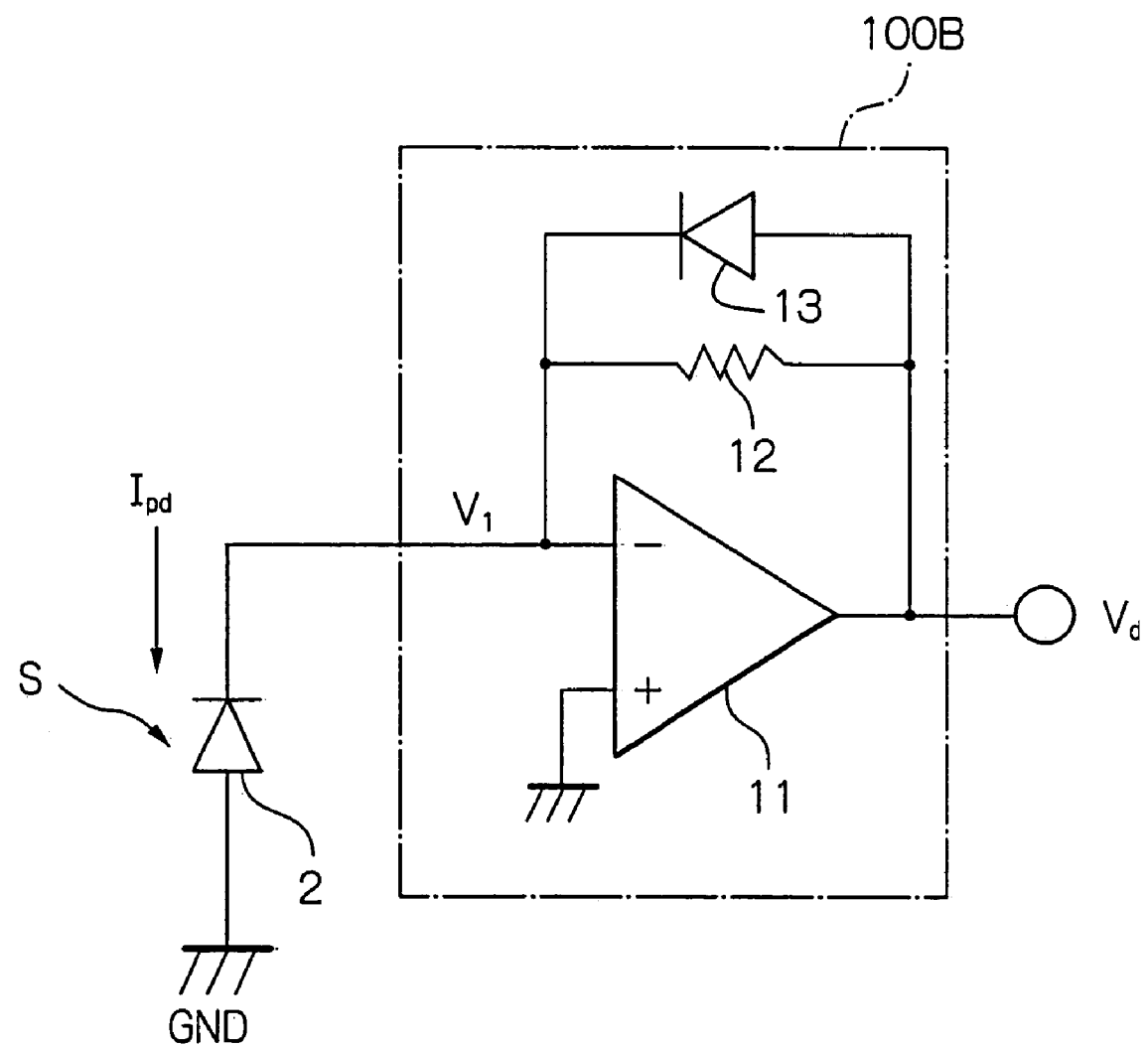
FIG. 2 is a circuit diagram illustrating a second prior art photocurrent-to-voltage conversion apparatus.

In FIG. 2, which illustrates a second prior art photocurrent-to-voltage conversion apparatus (see: FIG. 5 of JP-A-61-41213), this photocurrent-to-voltage conversion apparatus 100B is constructed by a diode 13 serving as a clamp element connected in parallel with the negative feedback resistor 12 of FIG. 1, in order to suppress the waveform distortion between the light signal S and the detection signal $V_d$. That is, when the strength of the light signal S is small, the diode 13 is not turned ON, so that the detection voltage $V_d$ has a linear characteristic relative to the strength of the light signal S depending on the negative feedback resistor 12. On the other hand, when the strength of the light signal S is very large, so that the difference between the detection voltage $V_d$ and the voltage $V_1$ exceeds a clamp voltage $V_{CL}$ such as 0.6 to 1.0V which is in this case the forward voltage $V_F$ of the diode 13, the current flowing through the diode 13 is remarkably increased. As a result, the difference between the detection voltage $V_d$ and the voltage $V_1$ is clamped at the clamp voltage $V_{CL}$, so that the detection voltage $V_d$ has a V–I characteristic of the diode 13.

Figure 3:
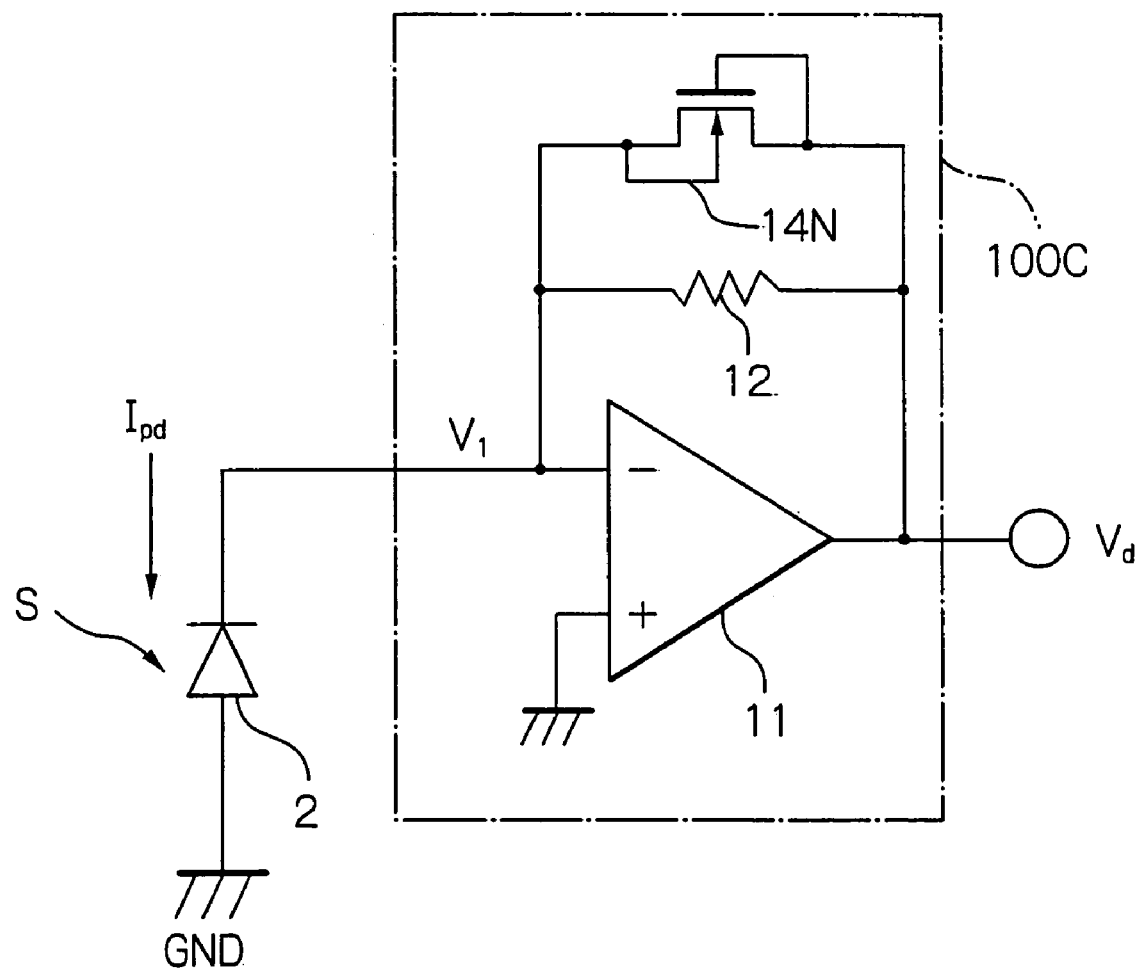
FIG. 3 is a circuit diagram illustrating a third prior art photocurrent-to-voltage conversion apparatus.

In FIG. 3, which illustrates a third prior art photocurrent-to-voltage conversion apparatus (see: FIG. 1 of JP-A-61-41213), this photocurrent-to-voltage conversion apparatus 100C is constructed by a diode-connected N-channel enhancement-type MOS transistor 14N serving as a clamp element connected in parallel with the negative feedback resistor 12 of FIG. 1, in order to suppress the waveform distortion between the light signal S and the detection signal $V_d$. That is, when the strength of the light signal S is small, the transistor 14N is not turned ON, so that the detection voltage $V_d$ has a linear characteristic relative to the strength of the light signal S depending on the negative feedback resistor 12. On the other hand, when the strength of the light signal S is very large, so that the difference between the detection voltage $V_d$ and the voltage $V_1$ exceeds a clamp voltage $V_{CL}$ such as 0.6 to 1.0V which is in this case the threshold voltage $V_{thn}$ of the transistor 14N, the current flowing through the transistor 14N is remarkably increased. As a result, the difference between the detection voltage $V_d$ and the voltage $V_1$ is clamped at the clamp voltage $V_{CL}$, so that the detection voltage $V_d$ has a $V_g$–$I_d$ characteristic of the transistor 14N.

Figure 4A:
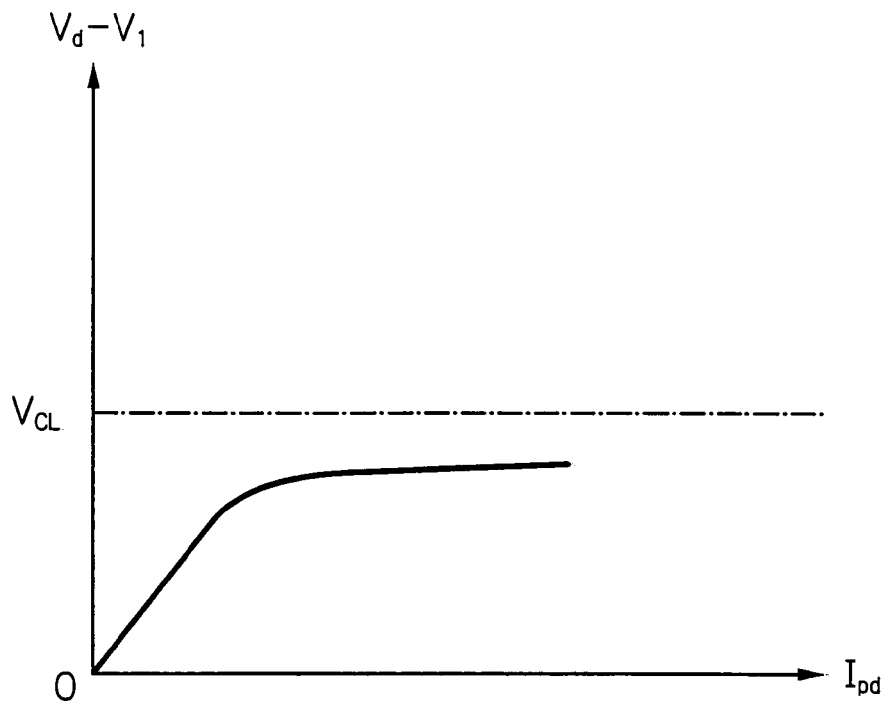
FIG. 4A is a graph showing a detection voltage saturation characteristic of FIGS. 2 and 3.
Figure 4B:
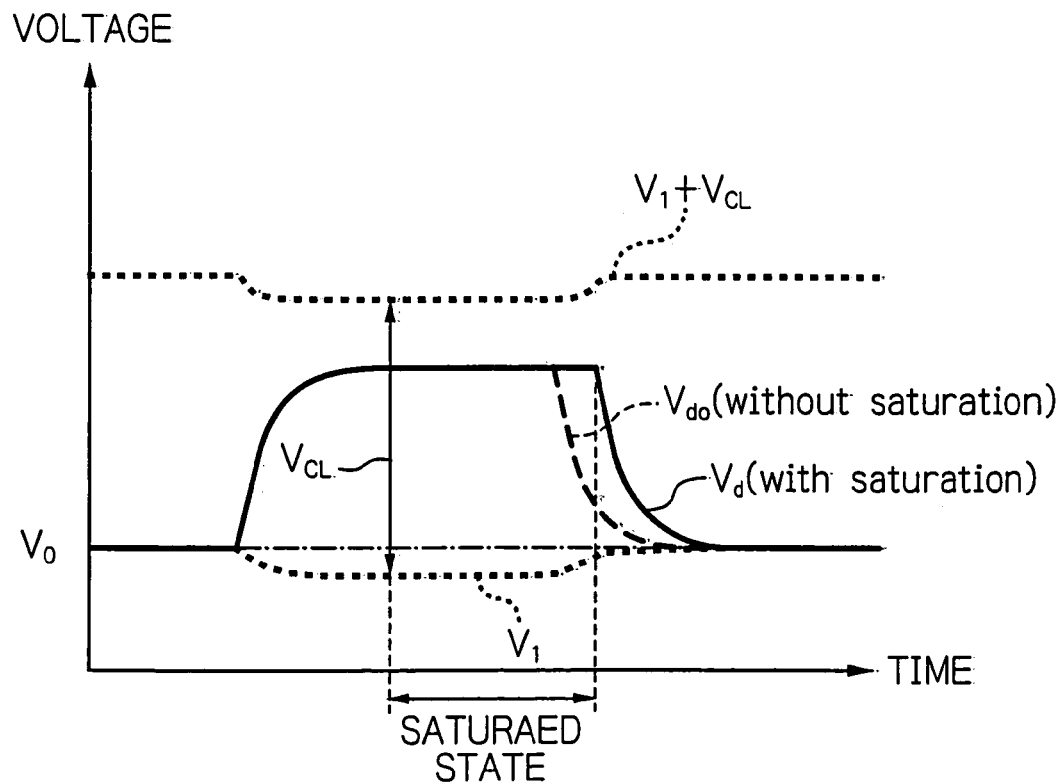
FIG. 4B is a timing diagram for explaining an operation of the photocurrent-to-voltage conversion apparatuses of FIGS. 2 and 3.

In the photocurrent-to-voltage conversion apparatuses 100B and 100C of FIGS. 2 and 3, however, when the difference ($V_d$–$V_1$) between the detection voltage $V_d$ and the voltage $V_1$ has a saturation characteristic as shown in FIG. 4A, the operational amplifier 11 is saturated before a current flows through the clamp element (13, 14N), so that the waveform distortion between the photocurrent $I_{pd}$ (or the voltage $V_1$) and the detection voltage $V_d$ would be still generated as shown in FIG. 4B. Note that $V_{d0}$ of FIG. 4B is an ideal detection voltage for the saturation characteristic of FIG. 4A.

Figure 5A:
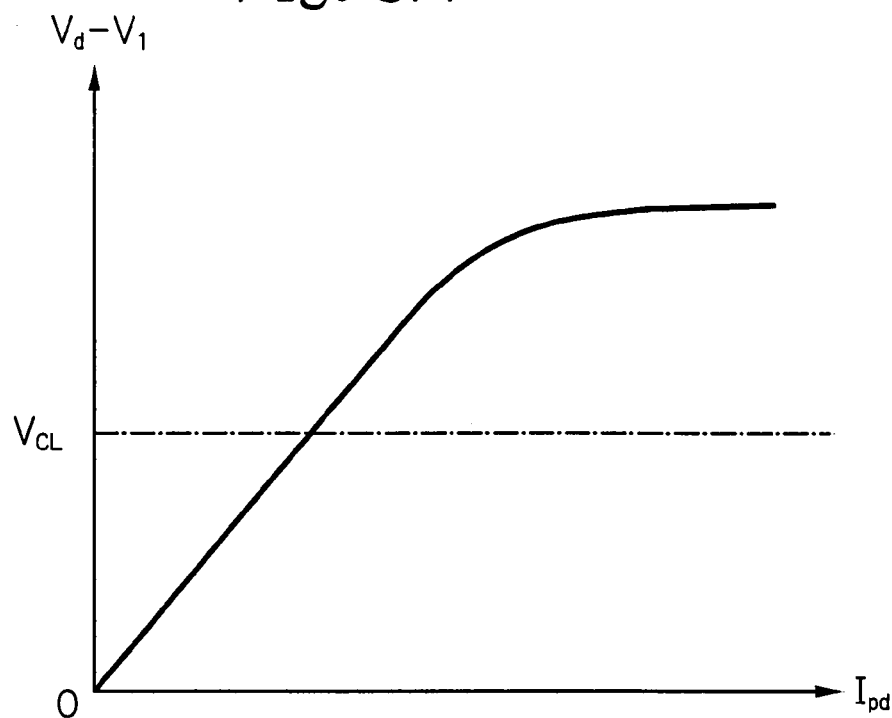
FIG. 5A is a graph showing another detection voltage saturation characteristic of FIGS. 2 and 3.
Figure 5B:
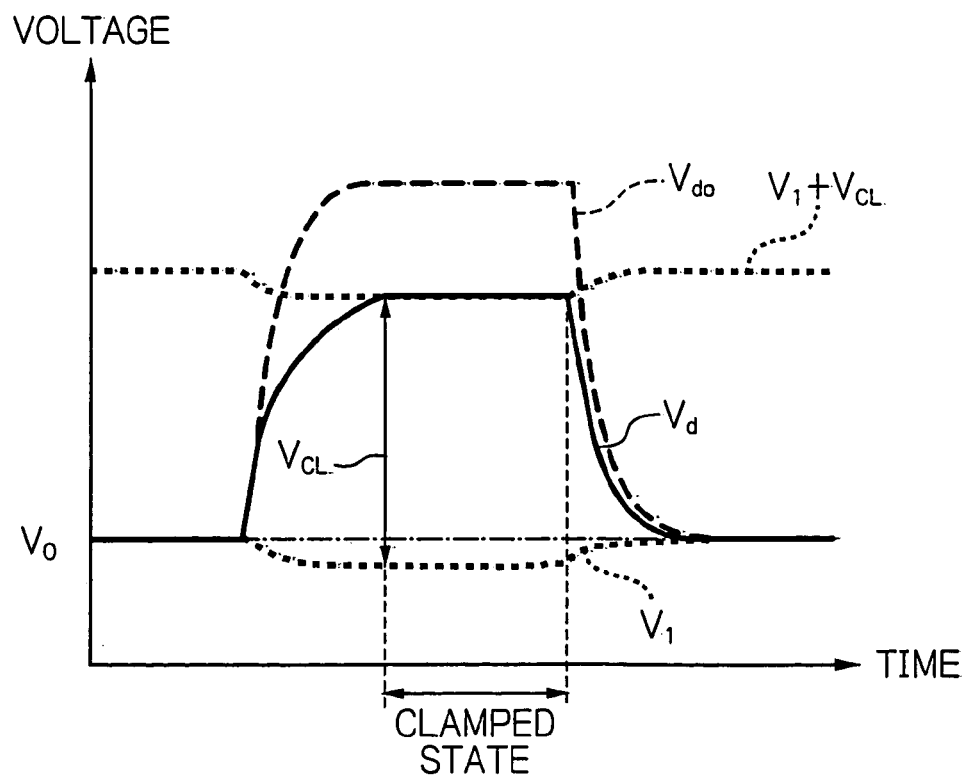
FIG. 5B is a timing diagram for explaining another operation of the photocurrent-to-voltage conversion apparatuses of FIGS. 2 and 3.

Also, in the photocurrent-to-voltage conversion apparatuses 100B and 100C of FIGS. 2 and 3, when the difference ($V_d$–$V_1$) between the detection voltage $V_d$ and the voltage $V_1$ has a saturation characteristic as shown in FIG. 5A, a current flows through the clamp element (13, 14N) before the operational amplifier 11 is saturated, so that the detection voltage $V_d$ is clamped at $V_1+V_{CL}$ as shown in FIG. 5B. Note that $V_{d0}$ of FIG. 5B is an ideal detection voltage for the saturation characteristic of FIG. 5A.

Figure 6A:
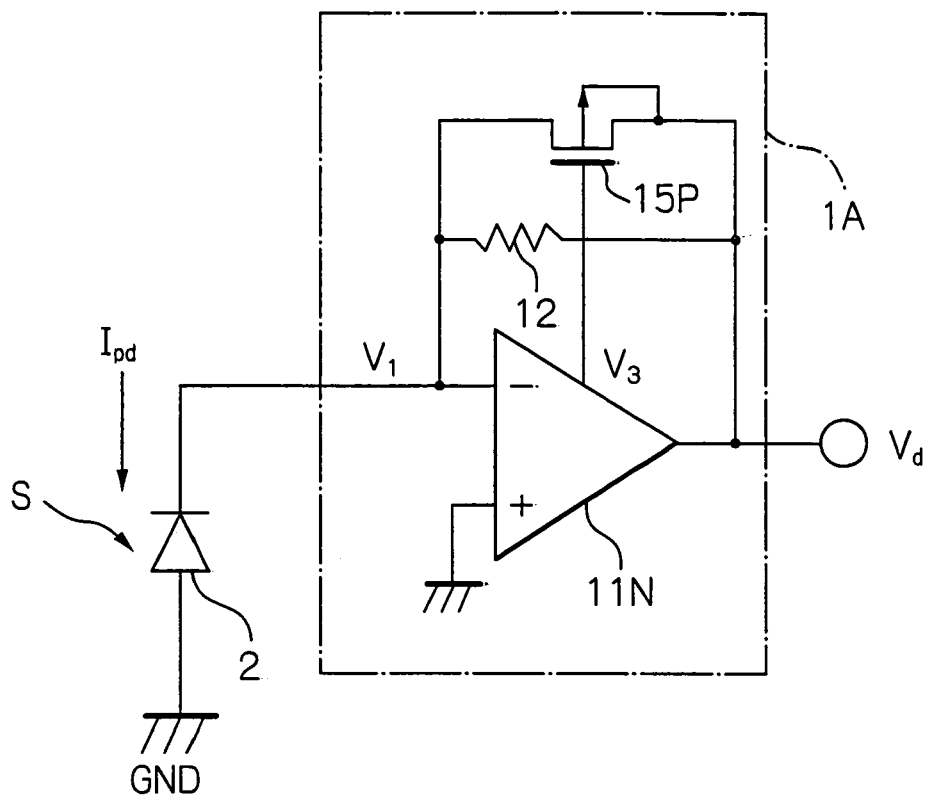
FIG. 6A is a circuit diagram illustrating a first embodiment of the photocurrent-to-voltage conversion apparatus according to the present invention.

In FIG. 6A, which illustrates a first embodiment of the photocurrent-to-voltage conversion apparatus according to the present invention, this photocurrent-to-voltage conversion apparatus 1A is constructed by a P-channel enhancement-type MOS transistor 15P instead of the N-channel enhancement-type MOS transistor 14N of FIG. 3. In this case, a clamp voltage $V_{CL}$ of the P-channel enhancement-type MOS transistor 15P is determined by the absolute value of a threshold voltage $V_{thp}$ of the P-channel MOS transistor 15P. Also, the photocurrent-to-voltage conversion apparatus 1A is constructed by an operational amplifier 11N of an N-channel inverter type instead of the operational amplifier 11 of FIG. 3.

The P-channel enhancement-type MOS transistor 15P is non-diode-connected, i.e., the gate of the P-channel MOS transistor 15P is connected to an intermediate stage of the operational amplifier 11N.

Figure 6B:
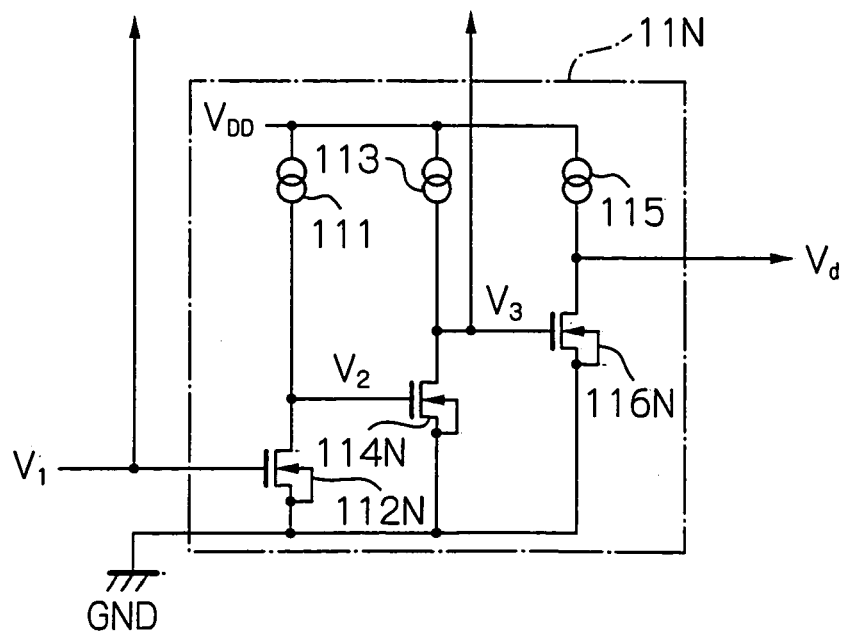
FIG. 6B is a detailed circuit diagram of the operational amplifier of FIG. 6A.

As illustrated in FIG. 6B, the operational amplifier 11N is constructed by a plurality of inverter stages which are in this case three inverter stages. The first stage is formed by a constant current source 111 and an N-channel enhancement-type MOS transistor 112N connected in series between a power supply terminal $V_{DD}$ and a ground terminal GND, the second stage is formed by a constant current source 113 and an N-channel enhancement-type MOS transistor 114N connected in series between the power supply terminal $V_{DD}$ and the ground terminal GND, and the final stage is formed by a constant current source 115 and an N-channel enhancement-type MOS transistor 116N connected in series between the power supply terminal $V_{DD}$ and the ground terminal GND. In this case, the constant current sources 111, 113 and 115 have the same driving power as each other, and the N-channel enhancement-type MOS transistors 112N, 114N and 116N have the same size as each other, so that the N-channel enhancement-type MOS transistors 112N, 114N and 116N have the same threshold voltage $V_{thn0}$.

Also, in FIG. 6B, $V_1$, $V_2$ and $V_3$ designates an input voltage of the first inverter stage (111, 112N), an output voltage of the first inverter stage (111, 112N) and an output voltage of the second inverter stage (113, 114N), respectively. The detection voltage $V_d$ is derived from the output of the final inverter stage (115, 116N), while the gate voltage of the MOS transistor 15P is derived from the output voltage $V_3$ of the second inverter stage (113, 114N).

Figure 7A:
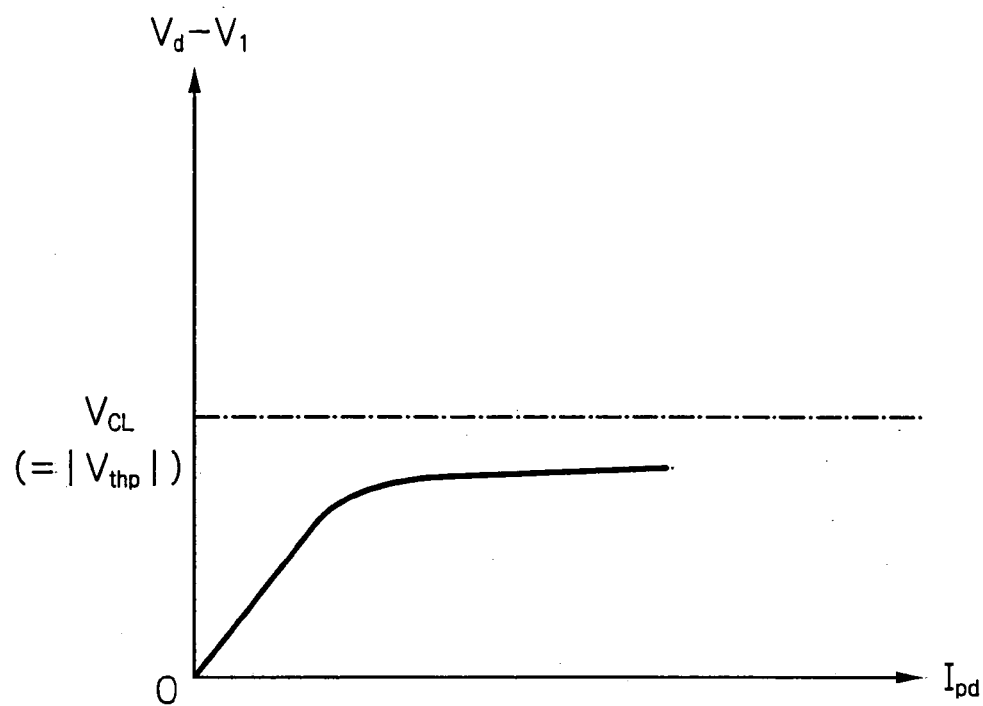
FIG. 7A is a graph showing a detection voltage saturation characteristic of FIGS. 6A and 6B.

As shown in FIG. 7A, the photocurrent-to-voltage conversion apparatus 1A of FIG. 6A is effective when the saturated voltage of the operational amplifier 11N is small so that the saturated difference between the detection voltage $V_d$ and the voltage $V_1$ is smaller than a clamp voltage $V_{CL}$ determined by a threshold voltage $V_{thp}$ of the P-channel MOS transistor 15P.

Figure 7B:
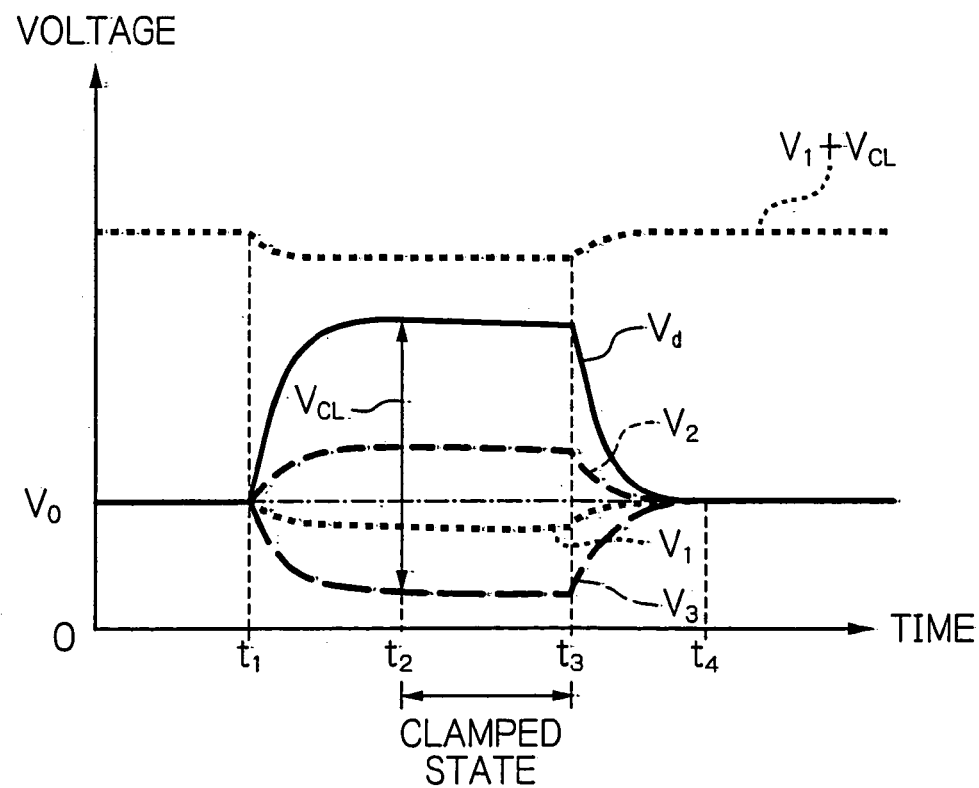
FIG. 7B is a timing diagram for explaining the operation of the photocurrent-to-voltage conversion apparatus of FIGS. 6A and 6B.

The operation of the photocurrent-to-voltage conversion apparatus 1A of FIGS. 6A and 6B is explained next with reference to FIG. 7B.

First, before time $t_1$, no photocurrent $I_{pd}$ flows through the photodiode 2. As a result, since no current flows through the negative feedback resistor 12, the detection voltage $V_d$ is the same as the voltage $V_1$, i.e., $$V_d=V_0=V_1=V_2=V_3 \qquad (3)$$

where $V_0$ is a reverse bias voltage determined by the threshold voltage $V_{thn0}$ of the N-channel enhancement-type MOS transistors 112N, 114N and 116N. In this case, since the gate voltage (=$V_d$–$V_3$) of the P-channel MOS transistor 15P is zero, the P-channel MOS transistor 15P is turned OFF.

Next, at time $t_1$, when a light signal S is incident to the photodiode 2, a photocurrent $I_{pd}$ flows therethrough. As a result, the photocurrent $I_{pd}$ flows through the negative feedback resistor 12, so that the voltage $V_1$ at the input of the first inverter (111, 112N) is decreased from $V_0$. Also, the decrease of the voltage $V_1$ is inversely-amplified by the first inverter stage (111, 112N) with respect to the voltage $V_0$ to increase the voltage $V_2$. Further, the increase of the voltage $V_2$ is inversely-amplified by the second inverter stage (113, 114N) with respect to the voltage $V_0$ to decrease the voltage $V_3$. Finally, the decrease of the voltage $V_3$ is inversely-amplified by the third inverter stage (115, 116N) with respect to the voltage $V_0$ to increase the detection voltage $V_d$. Thus, $$V_3<V_1<V_0<V_2<V_d \qquad (4)$$

Even in this case, since the gate voltage (=$V_d$–$V_3$) of the P-channel MOS transistor 15P is smaller than the clamp voltage $V_{CL}$, the P-channel enhancement-type MOS transistor 15P is still turned OFF.

Next, at time $t_2$, when the strength of the light signal S incident to the photodiode 2 is enhanced, the gate voltage (=$V_d$–$V_3$) of the P-channel MOS transistor 15P reaches the clamp voltage $V_{CL}$, the P-channel MOS transistor 15P enters a clamped state. That is, a part of the photocurrent $I_{pd}$ flows through the P-channel MOS transistor 15P before the operational amplifier 11N is saturated.

Finally, at time $t_3$, when the light signal S incident to the photodiode 2 is cut off, the voltages $V_1$, $V_2$, $V_3$ and $V_d$ are converged to $V_0$ at time $t_4$.

According to the first embodiment as illustrated in FIG. 6A, 6B, 7A and 7B, the absolute value of the gate-to-source voltage (=$V_d$–$V_3$) of the P-channel MOS transistor 15P is larger than the absolute value of the drain-to-source voltage (=$V_d$–$V_1$) thereof. As a result, since the P-channel MOS transistor 15P enters a clamped state before the operational amplifier 11N is saturated, the saturation of the operational amplifier 11N can be suppressed.

Figure 8A:
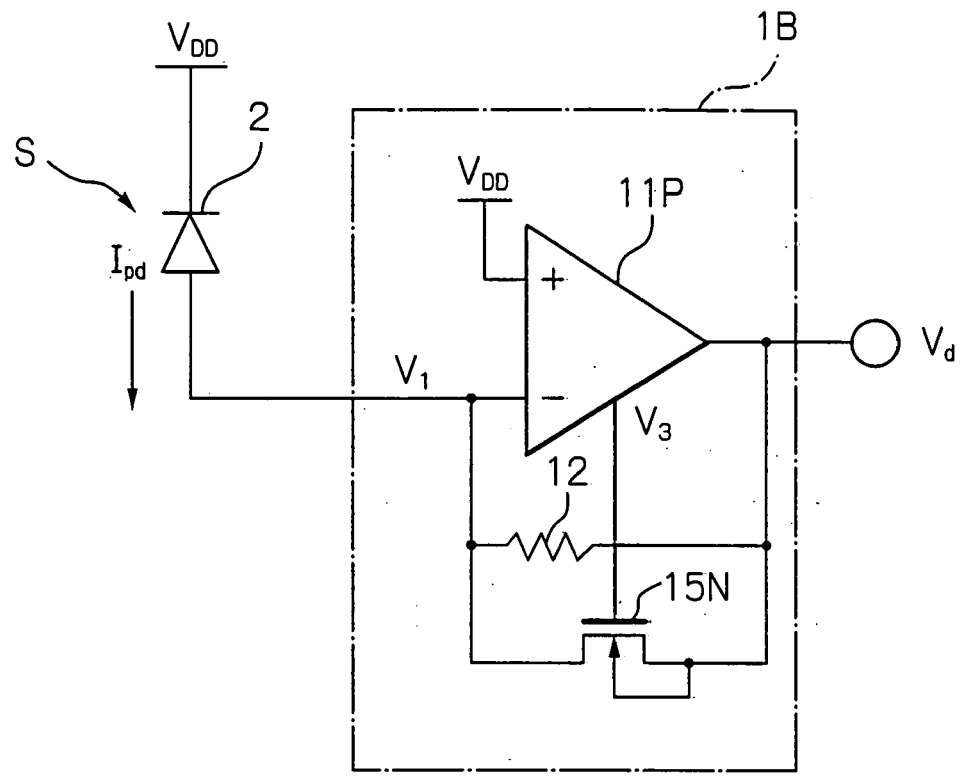
FIG. 8A is a circuit diagram illustrating a modification of the photocurrent-to-voltage conversion apparatus of FIG. 6A.

In FIG. 8A, which illustrates a modification of the photocurrent-to-voltage conversion apparatus of FIG. 6A, this photocurrent-to-voltage conversion apparatus 1B is connected to the anode of the photodiode 2 whose cathode is connected to the power supply terminal $V_{DD}$. This photocurrent-to-voltage conversion apparatus 1B is constructed by an N-channel enhancement-type MOS transistor 15N instead of the P-channel enhancement-type MOS transistor 15P of FIG. 6A. In this case, a clamp voltage $V_{CL}$ of the N-channel enhancement-type MOS transistor 15N is determined by the absolute value of a threshold voltage $V_{thn}$ of the N-channel MOS transistor 15N. Also, the photocurrent-to voltage conversion apparatus 1B is constructed by an operational amplifier 11P of a P-channel inverter type instead of the operational amplifier 11N of FIG. 6A.

Even in this case, the N-channel enhancement-type MOS transistor 15N is non-diode-connected, i.e., the gate of the N-channel MOS transistor 15N is connected to an intermediate stage of the operational amplifier 11P.

Figure 8B:
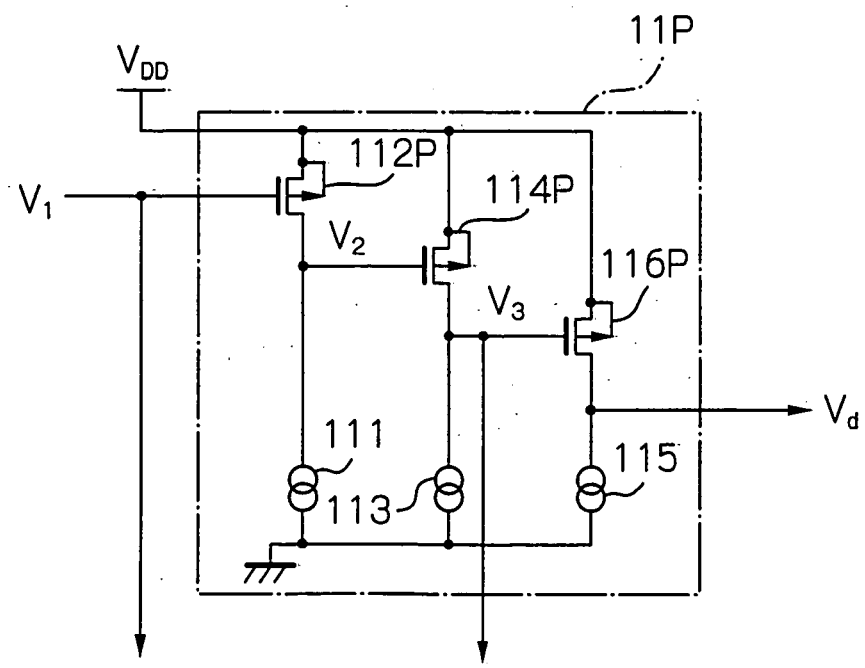
FIG. 8B is a detailed circuit diagram of the operational amplifier of FIG. 8A.

As illustrated in FIG. 8B, the operational amplifier 11P is constructed by a plurality of inverter stages which are in this case three inverter stages where P-channel enhancement-type MOS transistors 112P, 114P and 116P are provided instead of the N-channel enhancement-type MOS transistors 112N, 114N and 116N, respectively, of FIG. 6B. In this case, the P-channel enhancement-type MOS transistors 112P, 114P and 116P have the same size as each other, so that the P-channel enhancement-type MOS transistors 112P, 114P and 116P have the same threshold voltage $V_{thp0}$.

Figure 9A:
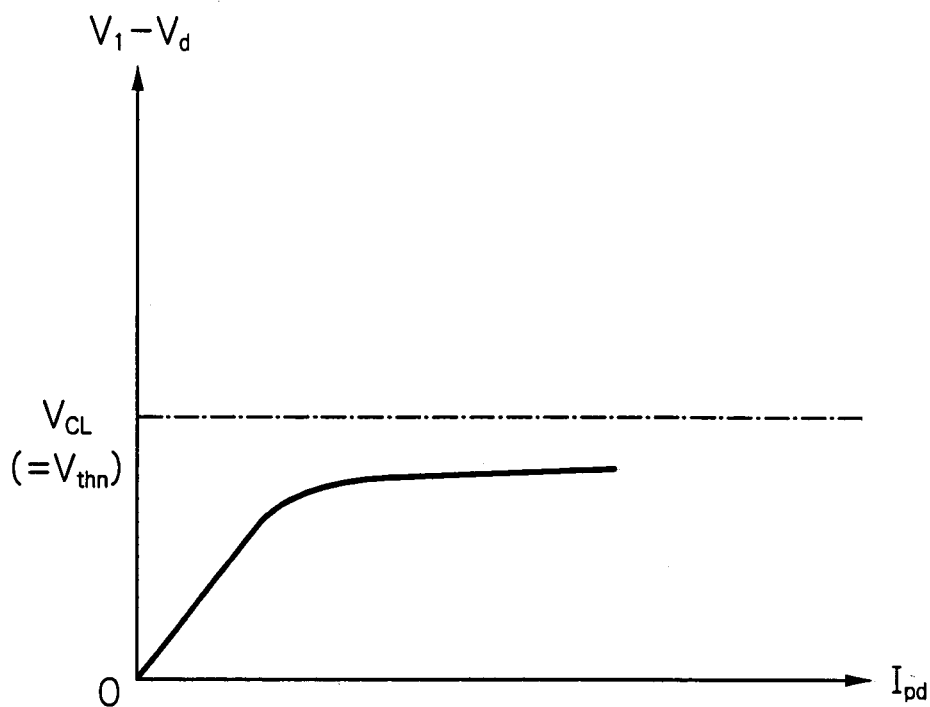
FIG. 9A is a graph showing a detection voltage saturation characteristic of FIGS. 8A and 8B.

As shown in FIG. 9A, the photocurrent-to-voltage conversion apparatus 1B of FIG. 8A is effective when the saturated voltage of the operational amplifier 11B is small so that the saturated difference between the voltage $V_1$ and the detection voltage $V_d$ is smaller than a clamp voltage $V_{CL}$ determined by a threshold voltage $V_{thn}$ of the N-channel MOS transistor 15N.

Figure 9B:
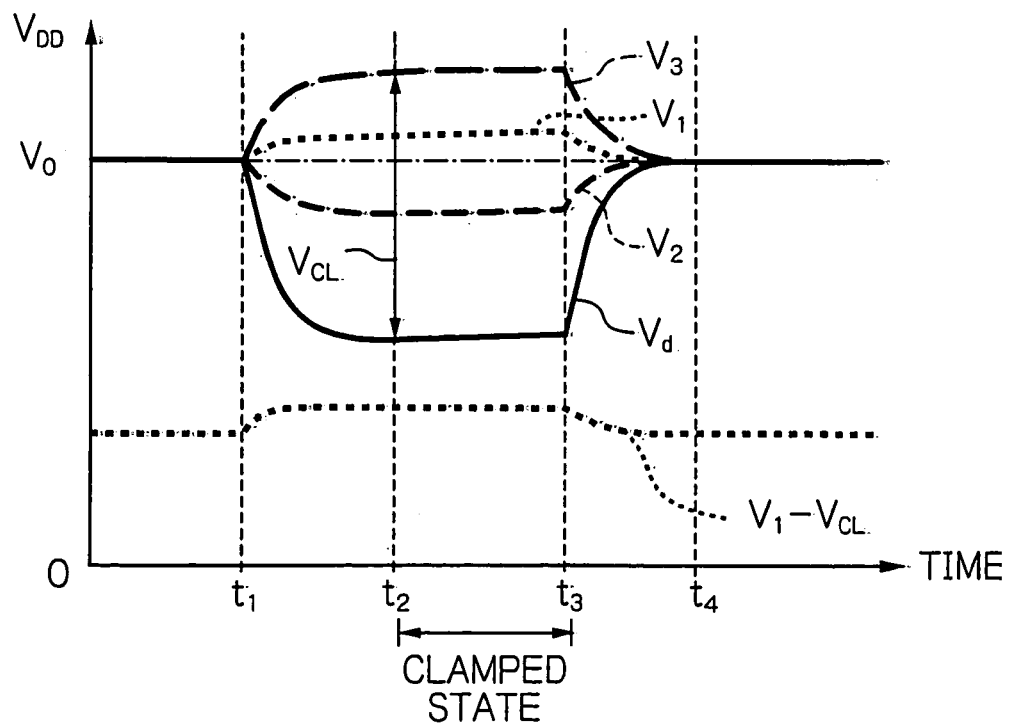
FIG. 9B is a timing diagram for explaining the operation of the photocurrent-to-voltage conversion apparatus of FIGS. 8A and 8B.

The operation of the photocurrent-to-voltage conversion apparatus 1B of FIGS. 8A and 8B is explained next with reference to FIG. 9B.

First, before time $t_1$, no photocurrent $I_{pd}$ flows through the photodiode 2. As a result, since no current flows through the negative feedback resistor 12, the detection voltage $V_d$ is the same as the voltage $V_1$, i.e., by the above-mentioned formula (3):

$$V_d=V_0=V_1=V_2=V_3$$

where $V_0$ is a reverse bias voltage determined by the threshold voltage $V_{thp0}$ of the P-channel enhancement-type MOS transistors 112P, 114P and 116P. In this case, since the gate voltage $(=V_3-V_d)$ of the N-channel MOS transistor 15N is zero, the N-channel MOS transistor 15N is turned OFF.

Next, at time $t_1$, when a light signal S is incident to the photodiode 2, a photocurrent $I_{pd}$ flows therethrough. As a result, the photocurrent $I_{pd}$ flows through the negative feedback resistor 12, so that the voltage $V_1$ at the input of the first inverter (111, 112P) is increased from $V_0$. Also, the increase of the voltage $V_1$ is inversely-amplified by the first inverter stage (111, 112P) with respect to the voltage $V_0$ to decrease the voltage $V_2$. Further, the decrease of the voltage $V_2$ is inversely-amplified by the second inverter stage (113, 114P) with respect to the voltage $V_0$ to increase the voltage $V_3$. Finally, the increase of the voltage $V_3$ is inversely-amplified by the third inverter stage (115, 116P) with respect to the voltage $V_0$ to decrease the detection voltage $V_d$. Thus, $$V_d<V_2<V_0<V_1<V_3 \quad (5)$$

Even in this case, since the gate voltage $(=V_3-V_d)$ of the N-channel MOS transistor 15N is smaller than the clamp voltage $V_{CL}$, the N-channel enhancement-type MOS transistor 15N is still turned OFF.

Next, at time $t_2$, when the strength of the light signal S incident to the photodiode 2 is enhanced, the gate voltage $(=V_3-V_d)$ of the N-channel MOS transistor 15N reaches the clamp voltage $V_{CL}$, so that the N-channel MOS transistor 15N enters a clamped state. That is, a part of the photocurrent $I_{pd}$ flows through the N-channel MOS transistor 15N before the operational amplifier 11P is saturated.

Finally, at time $t_3$, when the light signal S incident to the photodiode 2 is cut off, the voltages $V_1$, $V_2$, $V_3$ and $V_d$ are converged to $V_0$ at time $t_4$.

According to the modification of the first embodiment as illustrated in FIGS. 8A, 8B, 9A and 9B, the absolute value of the gate-to-source voltage $(=V_3-V_d)$ of the N-channel MOS transistor 15N is larger than the absolute value of the drain-to-source voltage $(=V_1-V_d)$ thereof. As a result, since the N-channel MOS transistor 15N enters a clamped state before the operational amplifier 11P is saturated, the saturation of the operational amplifier 11P can be suppressed.

Figure 10A:
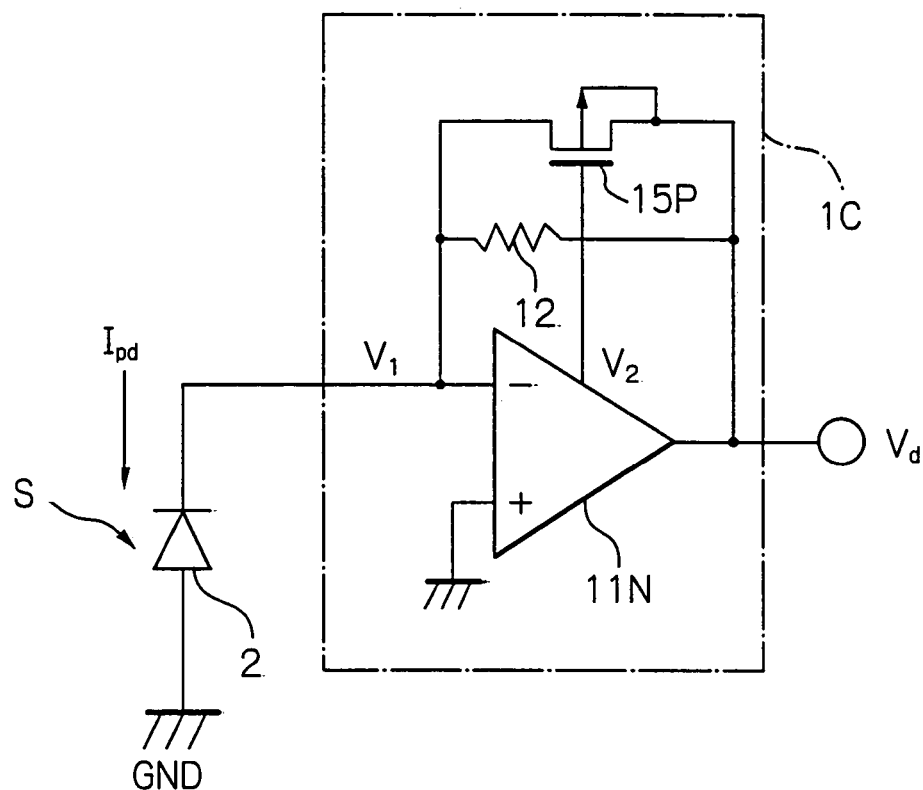
FIG. 10A is a circuit diagram illustrating a second embodiment of the photocurrent-to-voltage conversion apparatus according to the present invention.
Figure 10B:
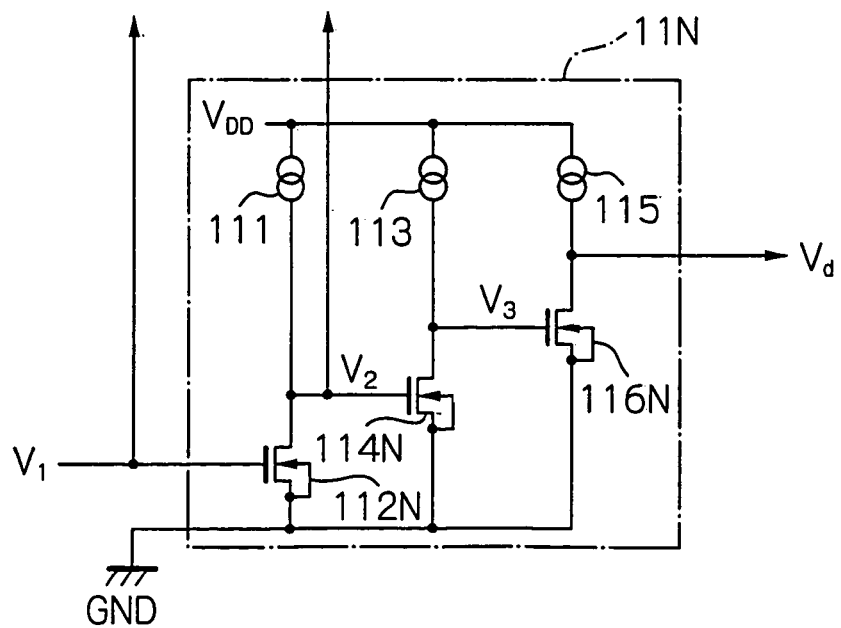
FIG. 10B is a detailed circuit diagram of the operational amplifier of FIG. 9A.

In FIG. 10A, which illustrates a second embodiment of the photocurrent-to-voltage conversion apparatus according to the present invention, the gate voltage of the MOS transistor 15P of this photocurrent-to-voltage conversion apparatus 1C is derived from the output voltage $V_2$ of the first inverter stage (111, 112N) as illustrated in FIG. 10B.

Figure 11A:
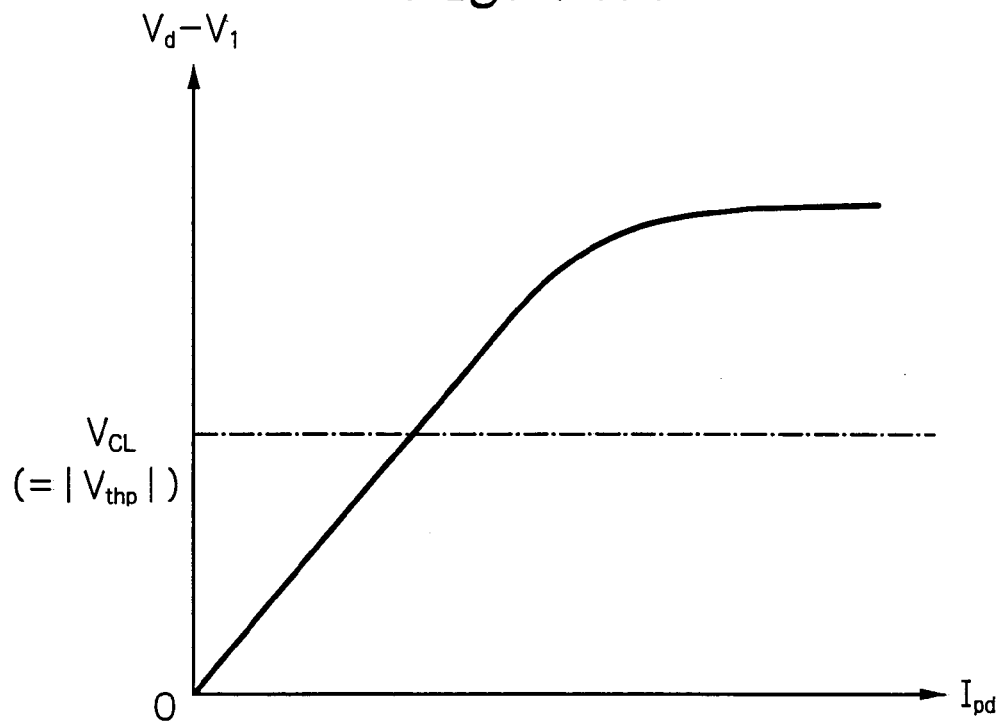
FIG. 11A is a graph showing a detection voltage saturation characteristic of FIGS. 10A and 10B.

As shown in FIG. 11A, the photocurrent-to-voltage conversion apparatus 1C of FIG. 10A is effective when the saturated voltage of the operational amplifier 11N is large so that the saturated difference between the detection voltage $V_d$ and the voltage $V_1$ is larger than the clamp voltage $V_{CL}$ determined by the threshold voltage $V_{thp}$ of the P-channel MOS transistor 15P.

Figure 11B:
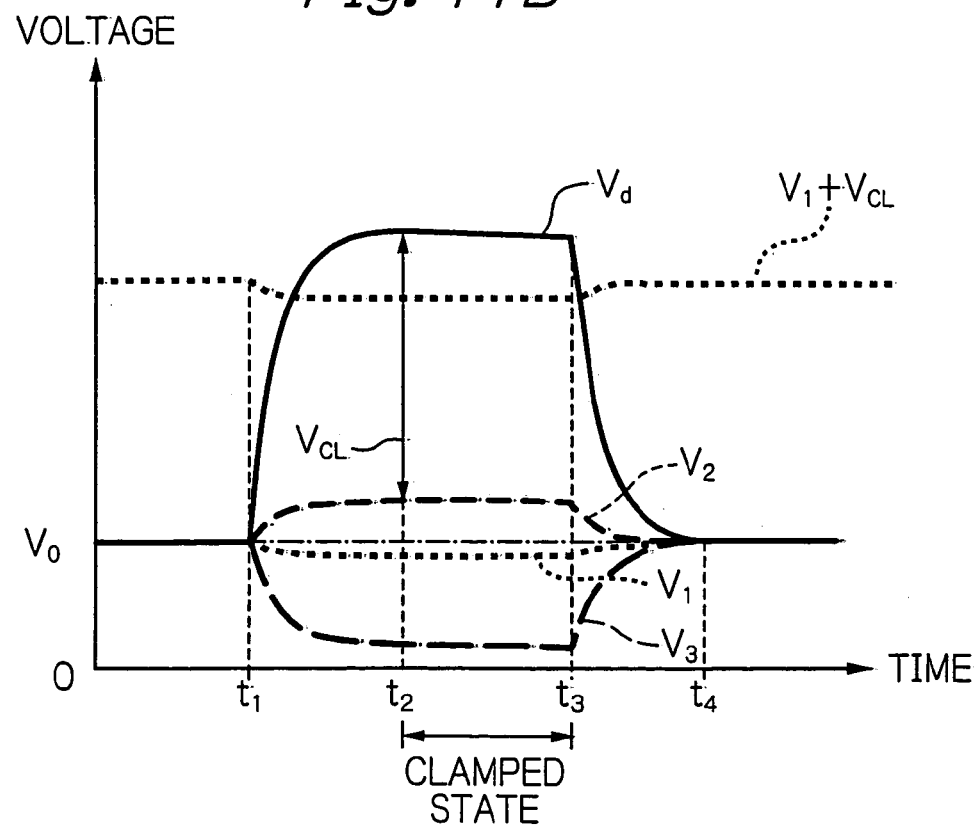
FIG. 11B is a timing diagram for explaining the operation of the photocurrent-to-voltage conversion apparatus of FIGS. 10A and 10B.

The operation of the photocurrent-to-voltage conversion apparatus 1C of FIGS. 10A and 10B is explained next with reference to FIG. 11B.

First, before time $t_1$, no photocurrent $I_{pd}$ flows through the photodiode 2. As a result, since no current flows through the negative feedback resistor 12, the detection voltage $V_d$ is the same as the voltage $V_1$, i.e., by the above-mentioned formula (3):

$$V_d=V_0=V_1=V_2=V_3$$

where $V_0$ is a reverse bias voltage determined by the threshold voltage $V_{thn0}$ of the N-channel enhancement-type MOS transistors 112N, 114N and 116N. In this case, since the gate voltage $(=V_d-V_2)$ of the P-channel MOS transistor 15P is zero, the P-channel MOS transistor 15P is turned OFF.

Next, at time $t_1$, when a light signal S is incident to the photodiode 2, a photocurrent $I_{pd}$ flows therethrough. As a result, the photocurrent $I_{pd}$ flows through the negative feedback resistor 12, so that the voltage $V_1$ at the input of the first inverter (111, 112N) is decreased from $V_0$. Also, the decrease of the voltage $V_1$ is inversely-amplified by the first inverter stage (111, 112N) with respect to the voltage $V_0$ to increase the voltage $V_2$. Further, the increase of the voltage $V_2$ is inversely-amplified by the second inverter stage (113, 114N) with respect to the voltage $V_0$ to decrease the voltage $V_3$. Finally, the decrease of the voltage $V_3$ is inversely-amplified by the third inverter stage (115, 116N) with respect to the voltage $V_0$ to increase the detection voltage $V_d$. Thus, from the above-mentioned formula (4), $$V_3<V_1<V_0<V_2<V_d$$

Even in this case, since the gate voltage $(=V_d-V_2)$ of the P-channel MOS transistor 15P is smaller than the clamp voltage $V_{CL}$, the P-channel enhancement-type MOS transistor 15P is still turned OFF.

Next, at time $t_2$, when the strength of the light signal S incident to the photodiode 2 is enhanced, the gate voltage $(=V_d-V_2)$ of the P-channel MOS transistor 15P reaches the clamp voltage $V_{CL}$, so that the P-channel MOS transistor 15P enters a clamped state. That is, a part of the photocurrent $I_{pd}$ flows through the P-channel MOS transistor 15P before the operational amplifier 11N is saturated. In this case, since the voltage $V_2$ is higher than the voltage $V_1$, the clamped detection voltage $V_d$ is higher than the prior art clamped detection voltage $V_d$ $(=V_1+V_{CL})$.

Finally, at time $t_3$, when the light signal S incident to the photodiode 2 is cut off, the voltages $V_1$, $V_2$, $V_3$ and $V_d$ are converged to $V_0$ at time $t_4$.

According to the second embodiment as illustrated in FIGS. 10A, 10B, 11A and 11B, the absolute value of the gate-to-source voltage $(=V_d-V_2)$ of the P-channel MOS transistor 15P is smaller than the absolute value of the drain-to-source voltage $(=V_d-V_1)$ thereof. As a result, the clamped detection voltage $V_d$ can be increased to an expected level.

Figure 12A:
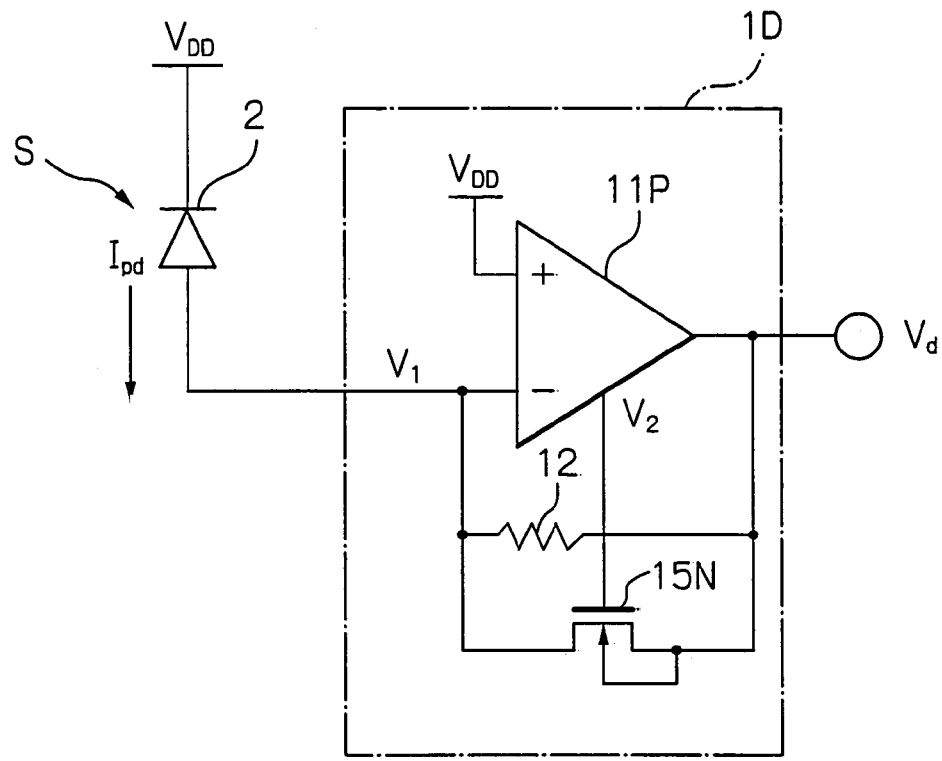
FIG. 12A is a circuit diagram illustrating a modification of the photocurrent-to-voltage conversion apparatus of FIG. 10A.

In FIG. 12A, which illustrates a modification of the photocurrent-to-voltage conversion apparatus of FIG. 10A, this photocurrent-to-voltage conversion apparatus 1D is connected to the anode of the photodiode 2 whose cathode is connected to the power supply terminal $V_{DD}$. This photocurrent-to-voltage conversion apparatus 1D is constructed by an N-channel enhancement-type MOS transistor 15N instead of the P-channel enhancement-type MOS transistor 15P of FIG. 10A. In this case, a clamp voltage $V_{CL}$ of the N-channel enhancement-type MOS transistor 15N is determined by a threshold voltage $V_{thn}$ of the N-channel MOS transistor 15N. Also, the photocurrent-to-voltage conversion apparatus 1D is constructed by an operational amplifier 11P of a P-channel inverter type instead of the operational amplifier 11N of FIG. 10A.

Figure 12B:
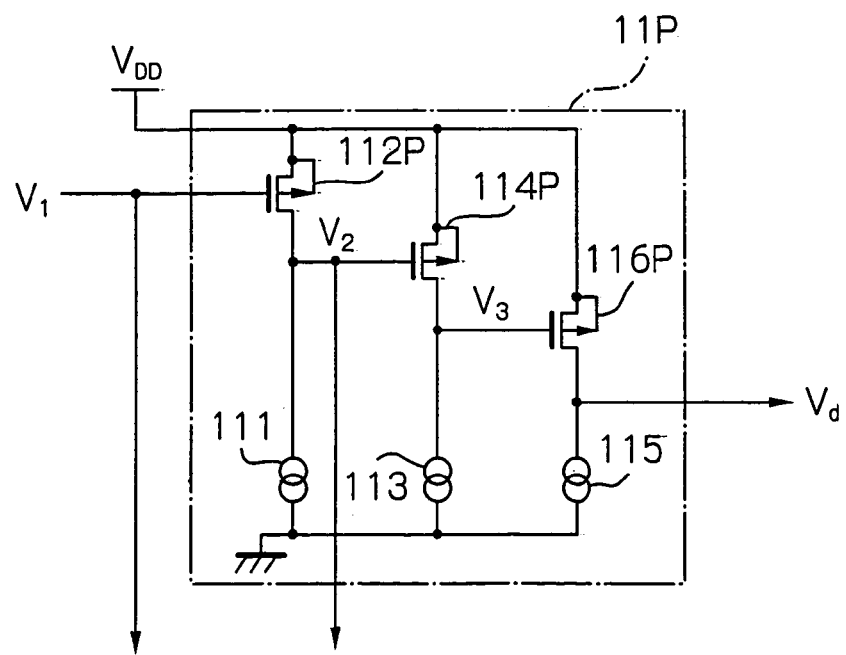
FIG. 12B is a detailed circuit diagram of the operational amplifier of FIG. 12A.

Even in this case, the N-channel enhancement-type MOS transistor 15N is non-diode-connected, i.e., the gate of the N-channel MOS transistor 15N is connected to an intermediate stage of the operational amplifier 11P, i.e., is derived from the output voltage $V_2$ of the first inverter stage (111, 112P) as illustrated in FIG. 12B.

Figure 13A:
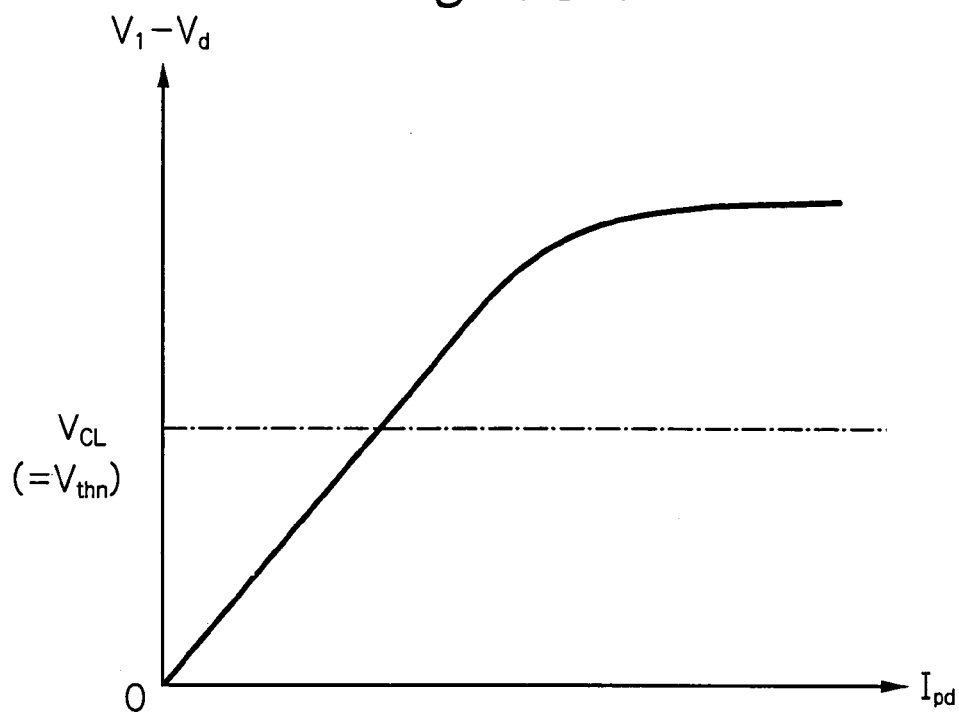
FIG. 13A is a graph showing a detection voltage saturation characteristic of FIGS. 12A and 12B.
Figure 13B:
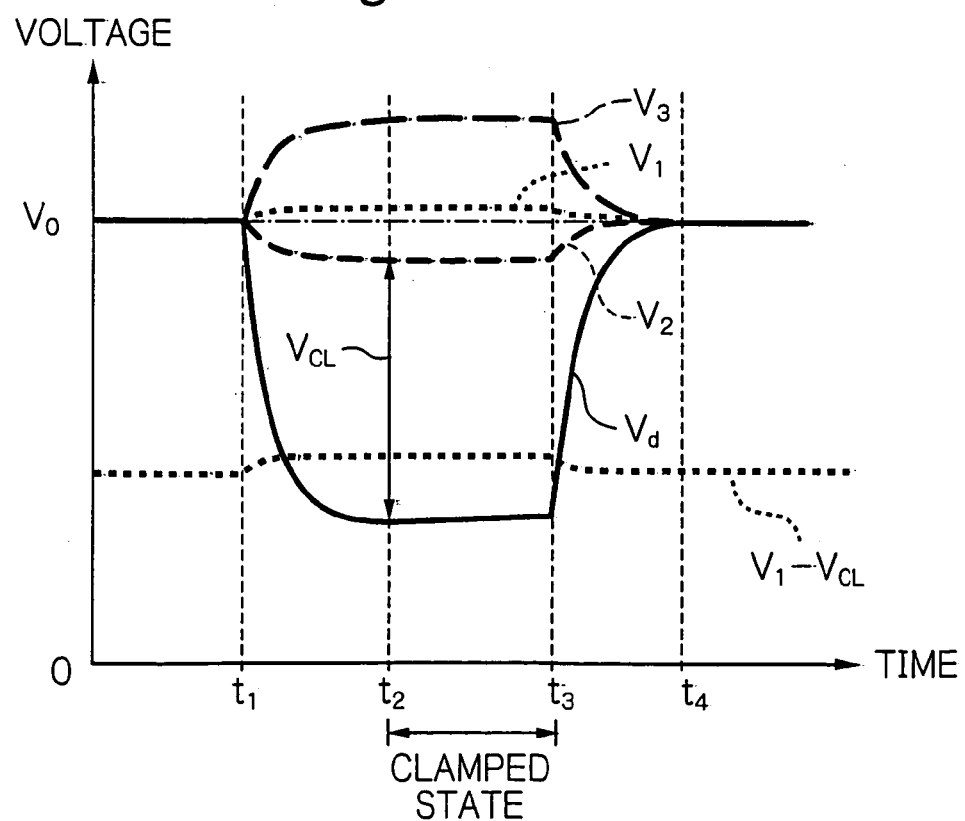
FIG. 13B is a timing diagram for explaining the operation of the photocurrent-to-voltage conversion apparatus of FIGS. 12A and 12B.

As illustrated in FIG. 13B, the operational amplifier 11P is constructed by a plurality of inverter stages which are in this case three inverter stages where P-channel enhancement-type MOS transistors 112P, 114P and 116P are provided instead of the N-channel enhancement-type MOS transistors 112N, 114N and 116N, respectively, of FIG. 10B. In this case, the P-channel enhancement-type MOS transistors 112P, 114P and 116P have the same size as each other, so that the P-channel enhancement-type MOS transistors 112P, 114P and 116P have the same threshold voltage $V_{thp0}$.

As shown in FIG. 13A, the photocurrent-to-voltage conversion apparatus 1D of FIG. 12A is effective when the saturated voltage of the operational amplifier 11D is large so that the saturated difference between the voltage $V_1$ and the detection voltage $V_d$ is smaller than a clamp voltage $V_{CL}$ determined by a threshold voltage $V_{thn}$ of the N-channel MOS transistor 15N.

The operation of the photocurrent-to-voltage conversion apparatus 1D of FIGS. 12A and 12B is explained next with reference to FIG. 13B.

First, before time $t_1$, no photocurrent $I_{pd}$ flows through the photodiode 2. As a result, since no current flows through the negative feedback resistor 12, the detection voltage $V_d$ is the same as the voltage $V_1$, i.e., by the above-mentioned formula (3):

$$V_d=V_0=V_1=V_2=V_3$$

where $V_0$ is a reverse bias voltage determined by the threshold voltage $V_{thp0}$ of the P-channel enhancement-type MOS transistors 112P, 114P and 116P. In this case, since the gate voltage $(=V_2-V_d)$ of the N-channel MOS transistor 15N is zero, the N-channel MOS transistor 15N is turned OFF.

Next, at time $t_1$, when a light signal S is incident to the photodiode 2, a photocurrent $I_{pd}$ flows therethrough. As a result, the photocurrent $I_{pd}$ flows through the negative feedback resistor 12, so that the voltage $V_1$ at the input of the first inverter (111, 112P) is increased from $V_0$. Also, the increase of the voltage $V_1$ is inversely-amplified by the first inverter stage (111, 112P) with respect to the voltage $V_0$ to decrease the voltage $V_2$. Further, the decrease of the voltage $V_2$ is inversely-amplified by the second inverter stage (113, 114P) with respect to the voltage $V_0$ to increase the voltage $V_3$. Finally, the increase of the voltage $V_3$ is inversely-amplified by the third inverter stage (115, 116P) with respect to the voltage $V_0$ to decrease the detection voltage $V_d$. Thus, from the above-mentioned formula (5), $$V_d<V_2<V_0<V_1<V_3$$

Even in this case, since the gate voltage $(=V_2-V_d)$ of the N-channel MOS transistor 15N is smaller than the clamp voltage $V_{CL}$, the N-channel enhancement-type MOS transistor 15N is still turned OFF.

Next, at time $t_2$, when the strength of the light signal S incident to the photodiode 2 is enhanced, the gate voltage $(=V_2-V_d)$ of the N-channel MOS transistor 15N reaches the clamp voltage $V_{CL}$, so that the N-channel MOS transistor 15N enters a clamped state. That is, a part of the photocurrent $I_{pd}$ flows through the N-channel MOS transistor 15N before the operational amplifier 11P is saturated. In this case, since the voltage $V_2$ is lower than the voltage $V_1$, the clamped detection voltage $V_d$ is lower than the prior art clamped detection voltage $V_d$ $(=V_1\ V_{CL})$.

Finally, at time $t_3$, when the light signal S incident to the photodiode 2 is cut off, the voltages $V_1$, $V_2$, $V_3$ and $V_d$ are converged to $V_0$ at time $t_4$.

According to the modification of the second embodiment as illustrated in FIGS. 12A, 12B, 13A and 13B, the absolute value of the gate-to-source voltage $(=V_2-V_d)$ of the N-channel MOS transistor 15N is smaller than the absolute value of the drain-to-source voltage $(=V_1-V_d)$ thereof. As a result, the clamped detection voltage $V_d$ can be decreased to an expected level.

Figure 14A:
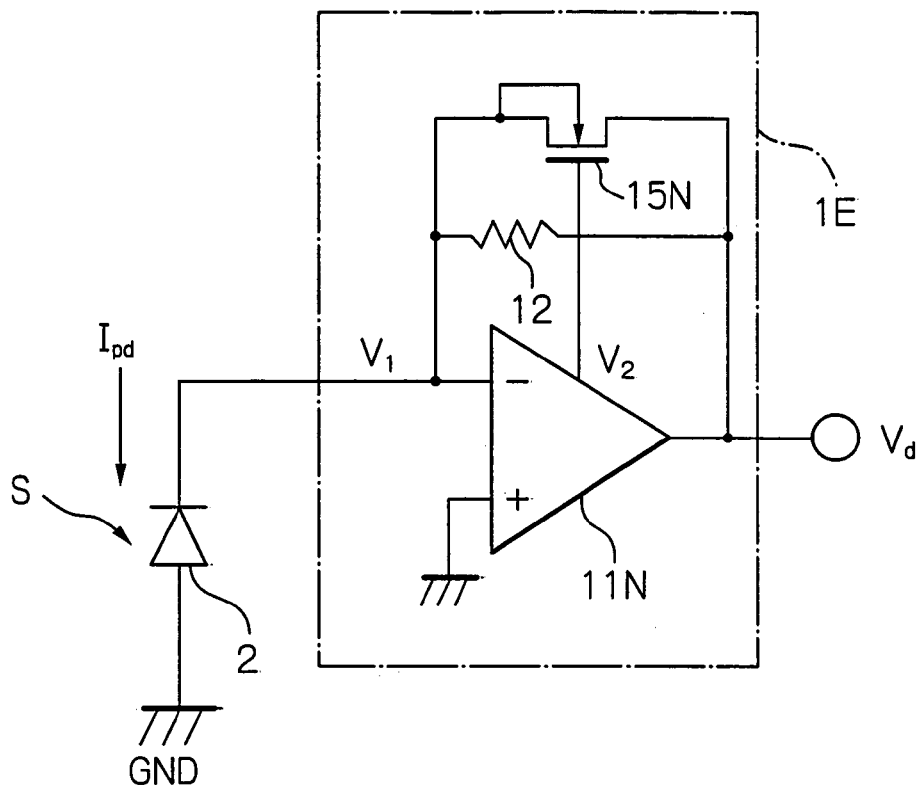
FIG. 14A is a circuit diagram illustrating a third embodiment of the photocurrent-to-voltage conversion apparatus according to the present invention.

In FIG. 14A, which illustrates a third embodiment of the photocurrent-to-voltage conversion apparatus according to the present invention, photocurrent-to-voltage conversion apparatus 1E includes an N-channel enhancement-type MOS transistor 15N instead of the P-channel enhancement-type MOS transistor 15P of FIG. 10A. The gate voltage of the N-channel enhancement-type MOS transistor 15N is also derived from the output voltage $V_2$ of the first inverter stage (111, 112N) as illustrated in FIG. 14B.

Figure 15A:
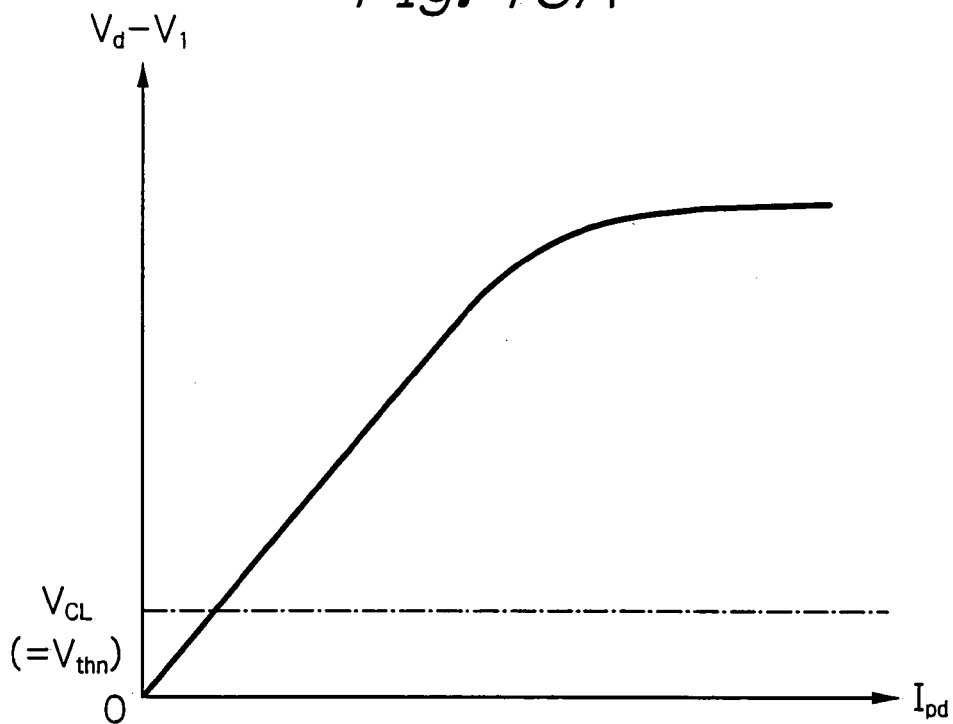
FIG. 15A is a graph showing a detection voltage saturation characteristic of FIGS. 14A and 14B.

As shown in FIG. 15A, the photocurrent-to-voltage conversion apparatus 1E of FIG. 14A is effective when the saturated voltage of the operational amplifier 11N is large so that the saturated difference between the detection voltage $V_d$ and the voltage $V_1$ is larger than a clamp voltage $V_{CL}$ determined by the threshold voltage $V_{thn}$ of the N-channel MOS transistor 15N.

Figure 14B:
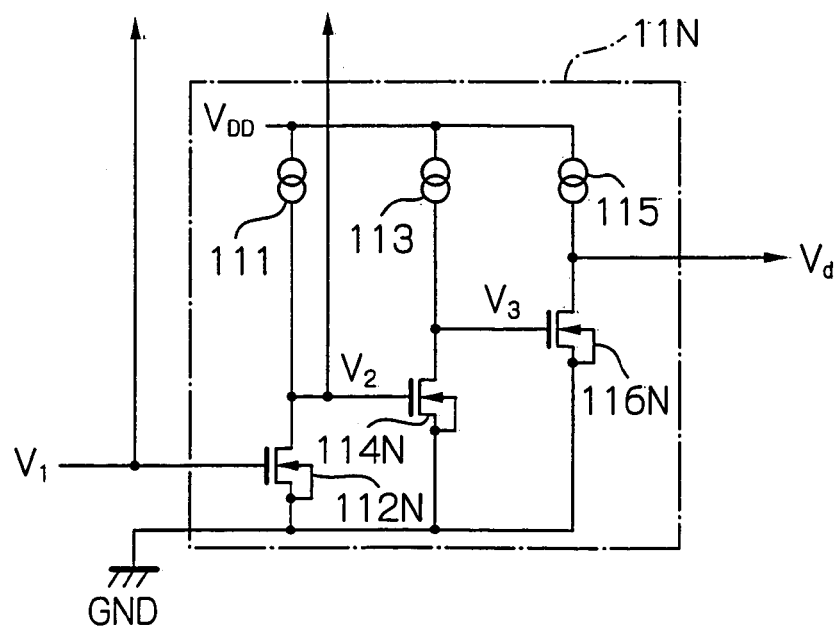
FIG. 14B is a detailed circuit diagram of the operational amplifier of FIG. 14A.
Figure 15B:
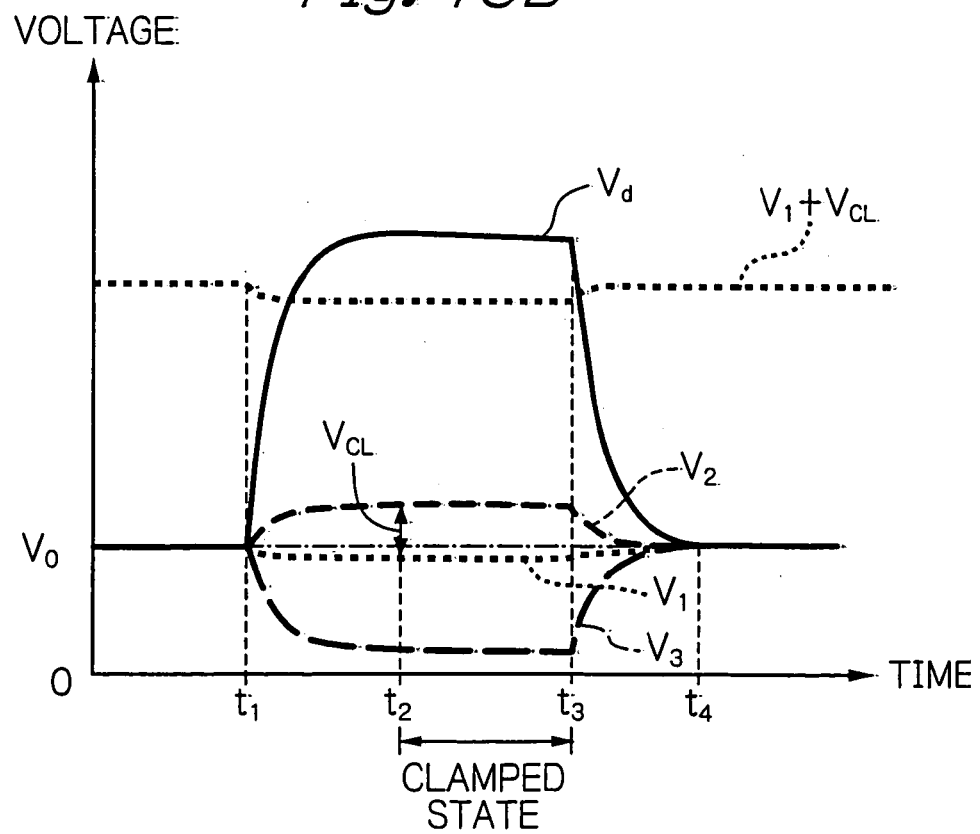
FIG. 15B is a timing diagram for explaining the operation of the photocurrent-to-voltage conversion apparatus of FIGS. 14A and 14B.

The operation of the photocurrent-to-voltage conversion apparatus 1E of FIGS. 14A and 14B is explained next with reference to FIG. 15B.

First, before time $t_1$, no photocurrent $I_{pd}$ flows through the photodiode 2. As a result, since no current flows through the negative feedback resistor 12, the detection voltage $V_d$ is the same as the voltage $V_1$, i.e., by the above-mentioned formula (3):

$$V_d = V_0 = V_1 = V_2 = V_3$$

where $V_0$ is a reverse bias voltage determined by the threshold voltage $V_{thn0}$ of the N-channel enhancement-type MOS transistors 112N, 114N and 116N. In this case, since the gate voltage ($=V_2-V_1$) of the N-channel MOS transistor 15N is zero, the N-channel MOS transistor 15N is turned OFF.

Next, at time $t_1$, when a light signal S is incident to the photodiode 2, a photocurrent $I_{pd}$ flows therethrough. As a result, the photocurrent $I_{pd}$ flows through the negative feedback resistor 12, so that the voltage $V_1$ at the input of the first inverter (111, 112N) is decreased from $V_0$. Also, the decrease of the voltage $V_1$ is inversely-amplified by the first inverter stage (111, 112N) with respect to the voltage $V_0$ to increase the voltage $V_2$. Further, the increase of the voltage $V_2$ is inversely-amplified by the second inverter stage (113, 114N) with respect to the voltage $V_0$ to decrease the voltage $V_3$. Finally, the decrease of the voltage $V_3$ is inversely-amplified by the third inverter stage (115, 116N) with respect to the voltage $V_0$ to increase the detection voltage $V_d$. Thus, from the above-mentioned formula (4), $$V_3 < V_1 < V_0 < V_2 < V_d$$

Even in this case, since the gate voltage ($=V_2-V_1$) of the N-channel MOS transistor 15N is smaller than the clamp voltage $V_{CL}$, the N-channel enhancement-type MOS transistor 15N is still turned OFF.

Next, at time $t_2$, when the strength of the light signal S incident to the photodiode 2 is enhanced, the gate voltage ($=V_2-V_1$) of the N-channel MOS transistor 15N reaches the clamp voltage $V_{CL}$, so that the N-channel MOS transistor 15N enters a clamped state. That is, a part of the photocurrent $I_{pd}$ flows through the N-channel MOS transistor 15N before the operational amplifier 11N is saturated. In this case, the clamped detection voltage $V_d$ is higher than the prior art clamped detection voltage $V_d$ ($=V_1+V_{CL}$).

Finally, at time $t_3$, when the light signal S incident to the photodiode 2 is cut off, the voltages $V_1$, $V_2$, $V_3$ and $V_d$ are converged to $V_0$ at time $t_4$.

According to the first embodiment as illustrated in FIGS. 14A, 14B, 15A and 15B, the absolute value of the gate-to-source voltage ($=V_2-V_1$) of the N-channel MOS transistor 15N is smaller than the absolute value of the drain-to-source voltage ($=V_d-V_1$) thereof. As a result, the clamped detection voltage $V_d$ can be increased to an expected level. Also, since the gate-to-source voltage of the N-channel MOS transistor 15N can be smaller than the gate-to-source voltage of the P-channel MOS transistor 15P of FIG. 10A, the clamped state from time $t_2$ can be delayed.

Figure 16A:
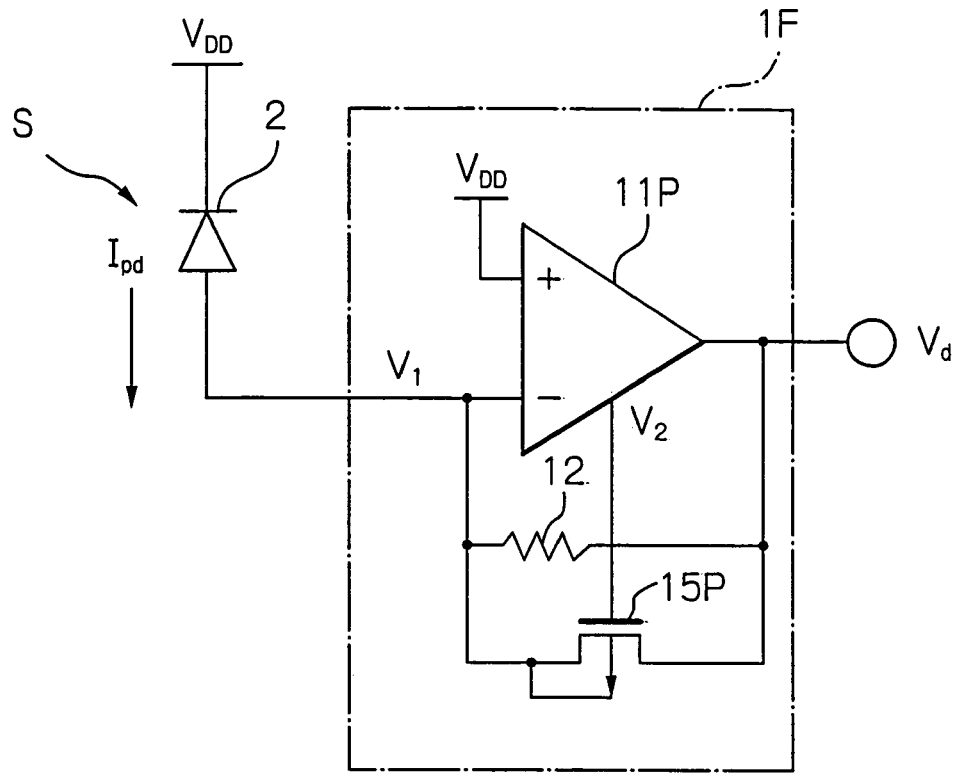
FIG. 16A is a circuit diagram illustrating a modification of the photocurrent-to-voltage conversion apparatus of FIG. 14A.

In FIG. 16A, which illustrates a modification of the photocurrent-to-voltage conversion apparatus of FIG. 14A, this photocurrent-to-voltage conversion apparatus 1F is connected to the anode of the photodiode 2 whose cathode is connected to the power supply terminal $V_{DD}$. In this photocurrent-to-voltage conversion apparatus 1F, a P-channel enhancement-type MOS transistor 15P is used instead of the N-channel enhancement-type MOS transistor 15N of FIG. 14A. In this case, a clamp voltage $V_{CL}$ of the P-channel enhancement-type MOS transistor 15P is determined by the absolute value of a threshold voltage $V_{thp}$ of the P-channel MOS transistor 15P. Also, the photocurrent-to-voltage conversion apparatus 1F includes an operational amplifier 11P of a P-channel inverter type instead of the operational amplifier 11N of FIG. 14A.

Figure 16B:
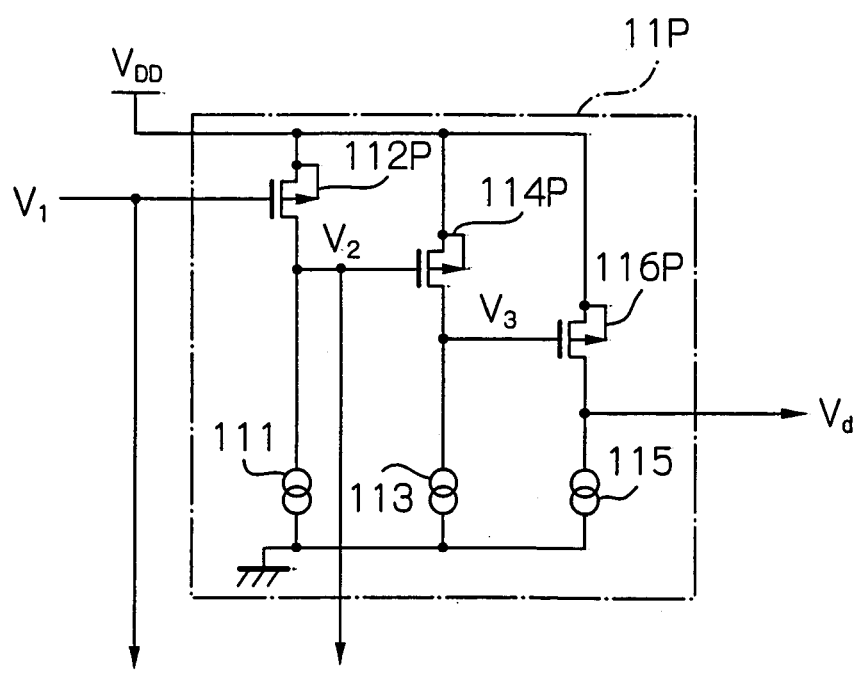
FIG. 16B is a detailed circuit diagram of the operational amplifier of FIG. 16A.

Even in this case, the P-channel enhancement-type MOS transistor 15P is non-diode-connected, i.e., the gate of the P-channel MOS transistor 15P is connected to an intermediate stage of the operational amplifier 11P, i.e., is derived from the output voltage $V_2$ of the first inverter stage (111, 112P) as illustrated in FIG. 16B.

Figure 17A:
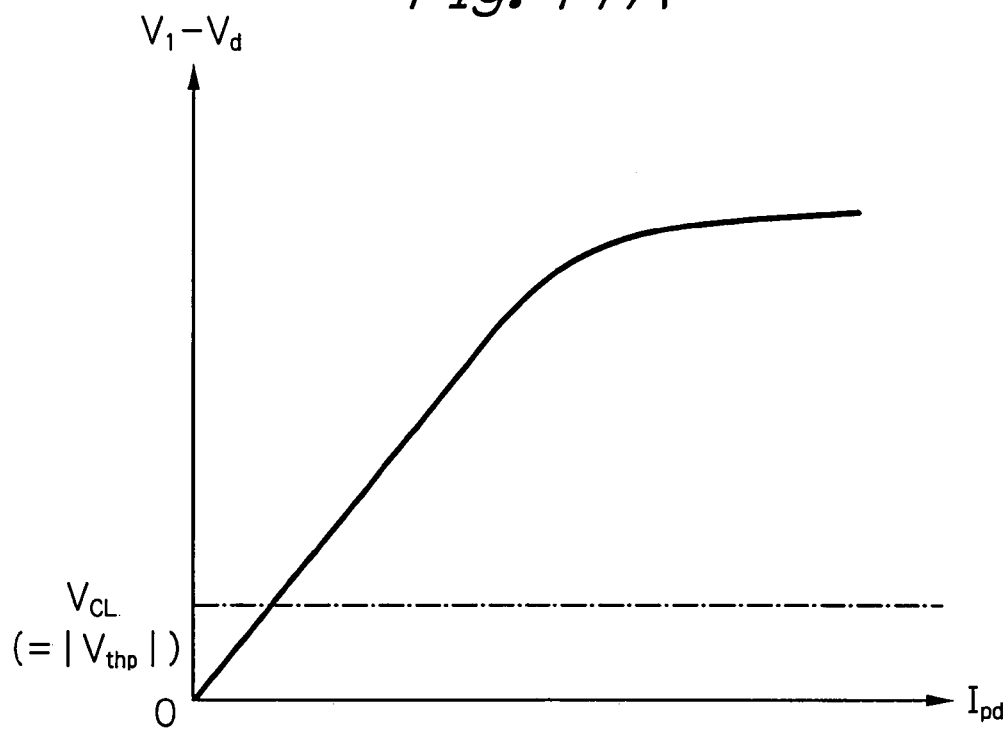
FIG. 17A is a graph showing a detection voltage saturation characteristic of FIGS. 16A and 16B.
Figure 17B:
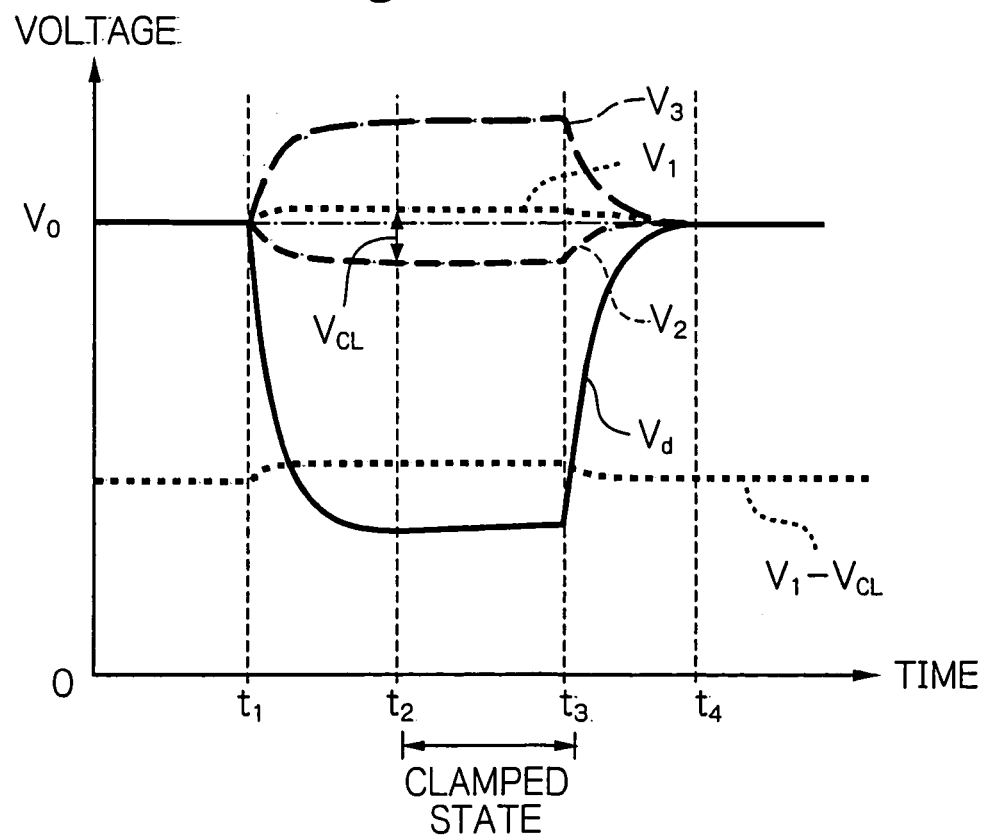
FIG. 17B is a timing diagram for explaining the operation of the photocurrent-to-voltage conversion apparatus of FIGS. 16A and 16B.

As illustrated in FIG. 17B, the operational amplifier 11P is constructed by a plurality of inverter stages which are in this case three inverter stages where P-channel enhancement-type MOS transistors 112P, 114P and 116P are provided instead of the N-channel enhancement-type MOS transistors 112N, 114N and 116N, respectively, of FIG. 10B. In this case, the P-channel enhancement-type MOS transistors 112P, 114P and 116P have the same size as each other, so that the P-channel enhancement-type MOS transistors 112P, 114P and 116P have the same threshold voltage $V_{thp0}$.

As shown in FIG. 17A, the photocurrent-to-voltage conversion apparatus 1F of FIG. 16A is effective when the saturated voltage of the operational amplifier 11F is large so that the saturated difference between the voltage $V_1$ and the detection voltage $V_d$ is smaller than a clamp voltage $V_{CL}$ determined by the absolute value of a threshold voltage $V_{thp}$ of the P-channel MOS transistor 15P.

The operation of the photocurrent-to-voltage conversion apparatus 1F of FIGS. 16A and 16B is explained next with reference to FIG. 17B.

First, before time $t_1$, no photocurrent $I_{pd}$ flows through the photodiode 2. As a result, since no current flows through the negative feedback resistor 12, the detection voltage $V_d$ is the same as the voltage $V_1$, i.e., by the above-mentioned formula (3):

$$V_d = V_0 = V_1 = V_2 = V_3$$

where $V_0$ is a reverse bias voltage determined by the threshold voltage $V_{thp0}$ of the P-channel enhancement-type MOS transistors 112P, 114P and 116P. In this case, since the gate voltage ($=V_1-V_2$) of the P-channel MOS transistor 15P is zero, the P-channel MOS transistor 15P is turned OFF.

Next, at time $t_1$, when a light signal S is incident to the photodiode 2, a photocurrent $I_{pd}$ flows therethrough. As a result, the photocurrent $I_{pd}$ flows through the negative feedback resistor 12, so that the voltage $V_1$ at the input of the first inverter (111, 112P) is increased from $V_0$. Also, the increase of the voltage $V_1$ is inversely-amplified by the first inverter stage (111, 112P) with respect to the voltage $V_0$ to decrease the voltage $V_2$. Further, the decrease of the voltage $V_2$ is inversely-amplified by the second inverter stage (113, 114P) with respect to the voltage $V_0$ to increase the voltage $V_3$. Finally, the increase of the voltage $V_3$ is inversely-amplified by the third inverter stage (115, 116P) with respect to the voltage $V_0$ to decrease the detection voltage $V_d$. Thus, from the above-mentioned formula (5), $$V_d < V_2 < V_0 < V_1 < V_3$$

Even in this case, since the gate voltage ($=V_1-V_2$) of the P-channel MOS transistor 15P is smaller than the clamp voltage $V_{CL}$, the P-channel enhancement-type MOS transistor 15P is still turned OFF.

Next, at time $t_2$, when the strength of the light signal S incident to the photodiode 2 is enhanced, the gate voltage ($=V_1-V_2$) of the P-channel MOS transistor 15P reaches the clamp voltage $V_{CL}$, so that the P-channel MOS transistor 15P enters a clamped state. That is, a part of the photocurrent $I_{pd}$ flows through the P-channel MOS transistor 15P before the operational amplifier 11P is saturated. In this case, since the voltage $V_2$ is lower than the voltage $V_1$, the clamped detection voltage $V_d$ is lower than the prior art clamped detection voltage $V_d$ ($=V_1-V_{CL}$).

Finally, at time $t_3$, when the light signal S incident to the photodiode 2 is cut off, the voltages $V_1$, $V_2$, $V_3$ and $V_d$ are converged to $V_0$ at time $t_4$.

According to the modification of the first embodiment as illustrated in FIGS. 16A, 16B, 17A and 17B, the absolute value of the gate-to-source voltage ($=V_1-V_2$) of the P-channel MOS transistor 15P is smaller than the absolute value of the drain-to-source voltage ($=V_1-V_d$) thereof. As a result, the clamped detection voltage $V_d$ can be decreased to an expected level. Also, since the gate-to-source voltage of the P-channel MOS transistor 15P can be smaller than the gate-to-source of the P-channel MOS transistor 15P of FIG. 12A, the clamped state from time $t_2$ can be delayed.

In the above-described embodiments and their modifications, the operational amplifier 11N or 11P is constructed by three inverter stages; however, the operational amplifier 11N or 11P can be generally constructed by (2n+1) inverter stages where n is 1, 2, . . . . In this case, the voltage $V_2$ can be derived from the output voltage of a m-th inverter stage where m is 1, 3, . . . , or 2n−1.

As explained hereinabove, according to the present invention, when the saturated voltage of the operational amplifier is small, the saturation of the operational amplifier can be suppressed. On the other hand, when the saturated voltage of the operational amplifier is large, the clamped level of the detection voltage can be an expected level.

The invention claimed is:

1. A photocurrent-to-voltage conversion apparatus for converting a photocurrent flowing through a light receiving element into a detection voltage, comprising:
   an amplifier having an input connected to said light receiving element and an output for generating said detection voltage, said amplifier including (2n+1) inverter stages connected in series where n is 1, 2 . . . ;
   a feedback resistor connected between the output and input of said amplifier; and
   a clamping MOS transistor connected between the output and input of said amplifier and being controlled by an output voltage of a non-final inverter one of said inverter stages.

2. The photocurrent-to-voltage conversion apparatus as set forth in claim 1, wherein said light receiving element comprises a reversely-biased photodiode.

3. The photo current-to-voltage conversion apparatus as set forth in claim 1, wherein said non-final inverter stage comprises an m-th inverter stage of said inverter stages where m is 2, 4, . . . , 2n, so that an absolute value of a gate-to-source voltage of said clamping MOS transistor is larger than an absolute value of a drain-to-source voltage of said clamping MOS transistor.

4. The photocurrent-to-voltage conversion apparatus as set forth in claim 3, wherein said clamping MOS transistor comprises a clamping P-channel enhancement-type MOS transistor whose gate is connected to an output of said m-th inverter stage, and
   wherein each of said inverter stages comprises a constant current source and an N-channel enhancement-type MOS transistor connected in series between a power supply terminal and a ground terminal.

5. The photocurrent-to-voltage conversion apparatus as set forth in claim 3, wherein said clamping MOS transistor comprises a clamping N-channel enhancement-type MOS transistor whose gate is connected to an output of said m-th inverter stage, and
   wherein each of said inverter stages comprises a P-channel enhancement-type MOS transistor and a constant current source connected in series between a power supply terminal and a ground terminal.

6. The photocurrent-to-voltage conversion apparatus as set forth in claim 1, wherein said non-final inverter stage comprises an m-th inverter stage of said inverter stages where m is 1, 3, . . . , 2n−1, so that an absolute value of a gate-to-source voltage of said clamping MOS transistor is smaller than an absolute value of a drain-to-source voltage of said clamping MOS transistor.

7. The photocurrent-to-voltage conversion apparatus as set forth in claim 6, wherein said clamping MOS transistor comprises a clamping P-channel enhancement-type MOS transistor whose gate is connected to an output of said m-th inverter stage, and
   wherein each of said inverter stages comprises a constant current source and an N-channel enhancement-type MOS transistor connected in series between a power supply terminal and a ground terminal.

8. The photocurrent-to-voltage conversion apparatus as set forth in claim 6, wherein said clamping MOS transistor comprises a clamping N-channel enhancement-type MOS transistor whose gate is connected to an output of said m-th inverter stage, and
   wherein each of said inverter stages comprises a P-channel enhancement-type MOS transistor and a constant current source connected in series between a power supply terminal and a ground terminal.

9. The photocurrent-to-voltage conversion apparatus as set forth in claim 6, wherein said clamping MOS transistor comprises a clamping N-channel enhancement-type MOS transistor whose gate is connected to an output of said m-th inverter stage, and
   wherein each of said inverter stages comprises a constant current source and an N-channel enhancement-type MOS transistor connected in series between a power supply terminal and a ground terminal.

10. The photocurrent-to-voltage conversion apparatus as set forth in claim 6, wherein said clamping MOS transistor comprises a clamping P-channel enhancement-type MOS transistor whose gate is connected to an output of said m-th inverter stage, and
    wherein each of said inverter stages comprises a P-channel enhancement-type MOS transistor and a constant current source connected in series between a power supply terminal and a ground terminal.

11. A photocurrent-to-voltage conversion apparatus for converting a photocurrent flowing through a reversely-biased photodiode having a grounded anode and a cathode into a detection voltage, comprising:
    an operational amplifier having an inverting input connected to the cathode of said photodiode, a grounded non-inverting input and an output for generating said detection voltage, said operational amplifier including (2n+1) inverter stages each formed by a constant current source and an N-channel enhancement-type MOS transistor connected in series between a power supply terminal and a ground terminal;

a negative feedback resistor connected between the output and inverting input of said operational amplifier; and a clamping P-channel enhancement-type MOS transistor connected between the output and inverting input of said operational amplifier, a gate of said clamping P-channel enhancement type MOS transistor being connected to an output of an m-th inverter one of said inverter stage where m is 2, 4, . . . , 2n, so that an absolute value of a gate-to-source voltage of said clamping P-channel enhancement-type MOS transistor is larger than an absolute value of a drain-to-source voltage of said clamping P-channel enhancement-type MOS transistor.

12. A photocurrent-to-voltage conversion apparatus for converting a photocurrent flowing through a reversely-biased photodiode having an anode and a cathode connected to a positive power supply terminal into a detection voltage, comprising:

an operational amplifier having an inverting input connected to the anode of said photodiode, a grounded non-inverting input and an output for generating said detection voltage, said operational amplifier including (2n+1) inverter stages each formed by a P-channel enhancement-type MOS transistor and a constant current source connected in series between said positive power supply terminal and a ground terminal;

a negative feedback resistor connected between the output and inverting input of said operational amplifier; and a clamping N-channel enhancement-type MOS transistor connected between the output and inverting input of said operational amplifier, a gate of said clamping N-channel enhancement type MOS transistor being connected to an output of an m-th inverter one of said inverter stage where m is 2, 4, . . . , 2n, so that an absolute value of a gate-to-source voltage of said clamping N-channel enhancement-type MOS transistor is larger than an absolute value of a drain-to-source voltage of said clamping N-channel enhancement-type MOS transistor.

13. A photocurrent-to-voltage conversion apparatus for converting a photocurrent flowing through a reversely-biased photodiode having a grounded anode and a cathode into a detection voltage, comprising:

an operational amplifier having an inverting input connected to the cathode of said photodiode, a grounded non-inverting input and an output for generating said detection voltage, said operational amplifier including (2n+1) inverter stages each formed by a constant current source and an N-channel enhancement-type MOS transistor connected in series between a power supply terminal and a ground terminal;

a negative feedback resistor connected between the output and inverting input of said operational amplifier; and a clamping P-channel enhancement-type MOS transistor connected between the output and inverting input of said operational amplifier, a gate of said clamping P-channel enhancement type MOS transistor being connected to an output of an m-th inverter one of said inverter stage where m is 1, 3, . . . , 2n−1, so that an absolute value of a gate-to-source voltage of said clamping P-channel enhancement-type MOS transistor is smaller than an absolute value of a drain-to-source voltage of said clamping P-channel enhancement-type MOS transistor.

14. A photocurrent-to-voltage conversion apparatus for converting a photocurrent flowing through a reversely-biased photodiode having an anode and a cathode connected to a positive power supply terminal into a detection voltage, comprising:

an operational amplifier having an inverting input connected to the anode of said photodiode, a grounded non-inverting input and an output for generating said detection voltage, said operational amplifier including (2n+1) inverter stages each formed by a P-channel enhancement-type MOS transistor and a constant current source connected in series between said positive power supply terminal and a ground terminal;

a negative feedback resistor connected between the output and inverting input of said operational amplifier; and a clamping N-channel enhancement-type MOS transistor connected between the output and inverting input of said operational amplifier, a gate of said clamping N-channel enhancement type MOS transistor being connected to an output of an m-th inverter one of said inverter stage where m is 1, 3, . . . , 2n−1, so that an absolute value of a gate-to-source voltage of said clamping N-channel enhancement-type MOS transistor is smaller than an absolute value of a drain-to-source voltage of said clamping N-channel enhancement-type MOS transistor.

15. A photocurrent-to-voltage conversion apparatus for converting a photocurrent flowing through a reversely-biased photodiode having a grounded anode and a cathode into a detection voltage, comprising:

an operational amplifier having an inverting input connected to the cathode of said photodiode, a grounded non-inverting input and an output for generating said detection voltage, said operational amplifier including (2n+1) inverter stages each formed by a constant current source and an N-channel enhancement-type MOS transistor connected in series between a power supply terminal and a ground terminal;

a negative feedback resistor connected between the output and inverting input of said operational amplifier; and a clamping N-channel enhancement-type MOS transistor connected between the output and inverting input of said operational amplifier, a gate of said clamping N-channel enhancement type MOS transistor being connected to an output of an m-th inverter one of said inverter stage where m is 1, 3, . . . , 2n−1, so that an absolute value of a gate-to-source voltage of said clamping N-channel enhancement-type MOS transistor is smaller than an absolute value of a drain-to-source voltage of said clamping P-channel enhancement-type MOS transistor.

16. A photocurrent-to-voltage conversion apparatus for converting a photocurrent flowing through a reversely-biased photodiode having an anode and a cathode connected to a positive power supply terminal into a detection voltage, comprising:

an operational amplifier having an inverting input connected to the anode of said photodiode, a grounded non-inverting input and an output for generating said detection voltage, said operational amplifier including (2n+1) inverter stages each formed by a P-channel enhancement-type MOS transistor and a constant current source connected in series between said positive power supply terminal and a ground terminal;

a negative feedback resistor connected between the output and inverting input of said operational amplifier; and a clamping P-channel enhancement-type MOS transistor connected between the output and inverting input of said operational amplifier, a gate of said clamping P-channel enhancement type MOS transistor being connected to an output of an m-th inverter one of said inverter stage where m is 1, 3, . . . , 2n−1, so that an absolute value of a gate-to-source voltage of said clamping P-channel enhancement-type MOS transistor is smaller than an absolute value of a drain-to-source voltage of said clamping P-channel enhancement-type MOS transistor.

* * * * *